US010875337B2

(12) United States Patent
Ter Meulen et al.

(10) Patent No.: US 10,875,337 B2
(45) Date of Patent: Dec. 29, 2020

(54) APPARATUS FOR IMPRINTING DISCRETE SUBSTRATES WITH A FLEXIBLE STAMP

(71) Applicant: MORPHOTONICS HOLDING B.V., Veldhoven (NL)

(72) Inventors: Jan Matthijs Ter Meulen, Eindhoven (NL); Bram Johannes Titulaer, Veldhoven (NL); Adrianus Johannes Van Erven, Casteren (NL); Ludovicus Vugts, Moergestel (NL); Jules Kierkels, Heythuysen (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 138 days.

(21) Appl. No.: 16/315,746

(22) PCT Filed: Jul. 11, 2017

(86) PCT No.: PCT/EP2017/067406
§ 371 (c)(1),
(2) Date: Jan. 7, 2019

(87) PCT Pub. No.: WO2018/011208
PCT Pub. Date: Jan. 18, 2018

(65) Prior Publication Data
US 2019/0329575 A1    Oct. 31, 2019

(30) Foreign Application Priority Data

Jul. 14, 2016 (EP) ...................................... 16179451

(51) Int. Cl.
*B41K 3/50*      (2006.01)
(52) U.S. Cl.
CPC ...................................... *B41K 3/50* (2013.01)

(58) Field of Classification Search
CPC .... B41K 3/50; B41K 1/02; B41K 1/36; G03F 7/00; G03F 7/20; G03F 7/0002;
(Continued)

(56) References Cited

U.S. PATENT DOCUMENTS 4,128,369 A    12/1978 Kemerer et al.
5,772,905 A    6/1998 Chou
(Continued)

FOREIGN PATENT DOCUMENTS

CN    103235483 A    8/2013
EP    1 473 594 A2    11/2004
(Continued)

OTHER PUBLICATIONS

Aug. 21, 2017 International Search Report issued in International Patent Application No. PCT/EP2017/067406.
(Continued)

*Primary Examiner* — Leslie J Evanisko
(74) *Attorney, Agent, or Firm* — Oliff PLC

(57) ABSTRACT

An apparatus for texturing or patterning discrete substrates by imprinting a curable lacquer with a discrete flexible stamp and curing the imprinted lacquer resulting in an additional functional textured layer on a discrete substrate is provided having at least a first and a second clamp, a first roller and at least one driven belt connected with the first clamp and with the second clamp and capable of moving the clamped flexible stamp wherein either the roller is not able to cause its own rotation, but is driven by the stamp which in turn is driven by the belt which in turn is driven by a belt driving device, or the roller is driven at the same speed as the belt by a roller driving device which follows the belt driving device in a master slave configuration.

15 Claims, 20 Drawing Sheets

(58) Field of Classification Search
CPC ..... B29C 59/00; B29C 59/026; B29C 59/046; B29C 2059/023; B29C 59/04; B30B 11/20
See application file for complete search history.

(56) References Cited

U.S. PATENT DOCUMENTS

| | | |
|---|---|---|
| 6,334,960 B1 | 1/2002 | Willson et al. |
| 7,296,519 B2 | 11/2007 | Dona et al. |
| 7,824,516 B2 | 11/2010 | Amos et al. |
| 8,027,086 B2 | 9/2011 | Guo et al. |
| 8,432,548 B2 | 4/2013 | Choi et al. |
| 2004/0065976 A1 | 4/2004 | Sreenivasan et al. |
| 2004/0219246 A1* | 11/2004 | Jeans .................. G03F 7/0005 425/174.4 |
| 2012/0256353 A1* | 10/2012 | Hasegawa .............. B29C 59/04 264/405 |
| 2013/0214452 A1 | 8/2013 | Choi et al. |
| 2014/0252679 A1 | 9/2014 | Hwang et al. |

FOREIGN PATENT DOCUMENTS

| | | |
|---|---|---|
| EP | 1 216 436 B1 | 2/2012 |
| FR | 2 893 610 A1 | 5/2007 |
| SG | 184034 A1 | 10/2012 |
| WO | 2016/012174 A1 | 1/2016 |

OTHER PUBLICATIONS

Chou, Stephen et al. "Imprint of sub-25 nm vias and trenches in polymers". Appl. Phys. Lett. 67, pp. 3114-3116, 1995.
Tan, Hua et al. "Roller nanoimprint lithography". J. Vac. Sci. Technol., B 16, pp. 3926-3928, 1998.

* cited by examiner

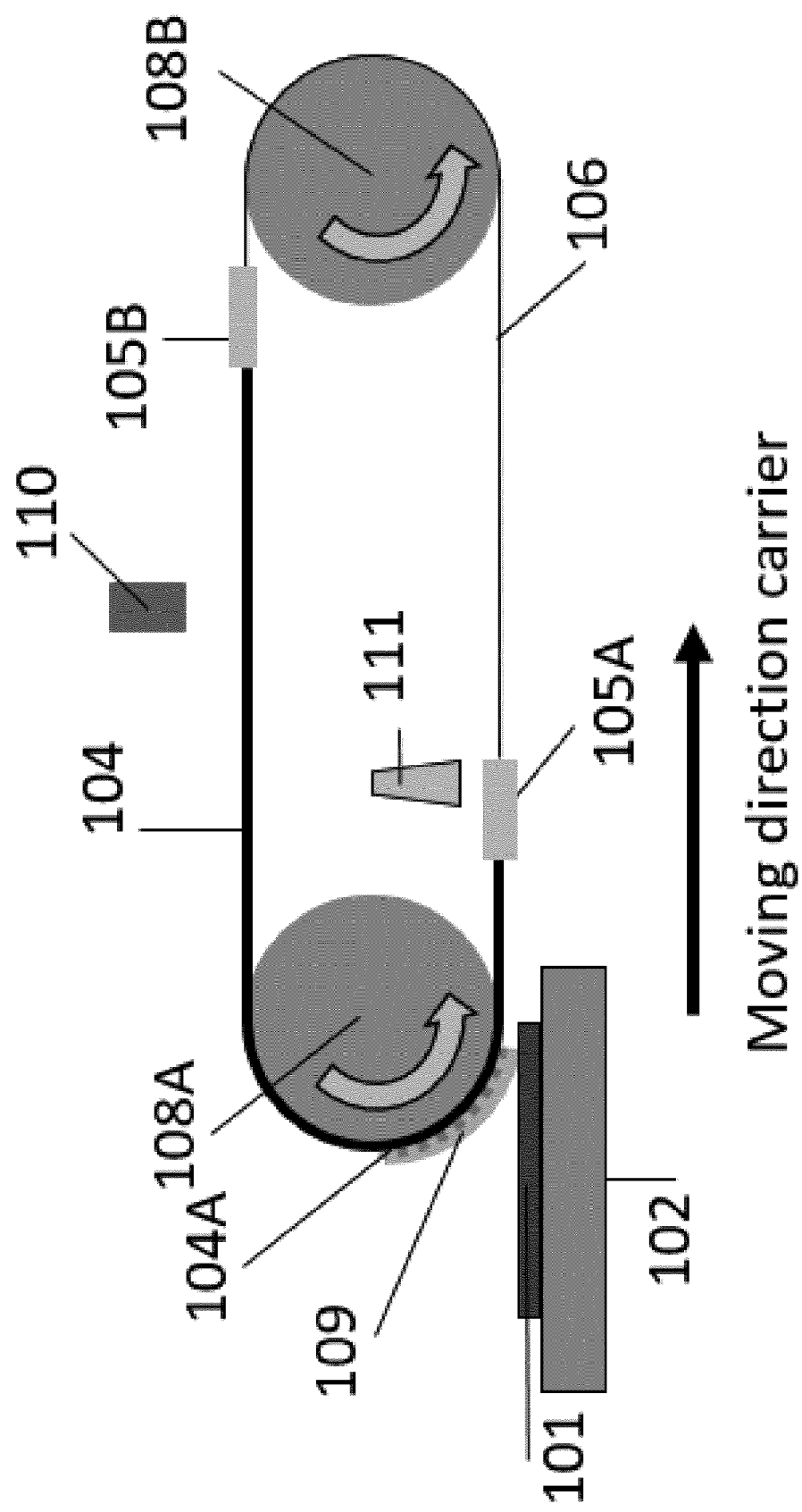
*Figure 1B (1): Start of imprinting step*

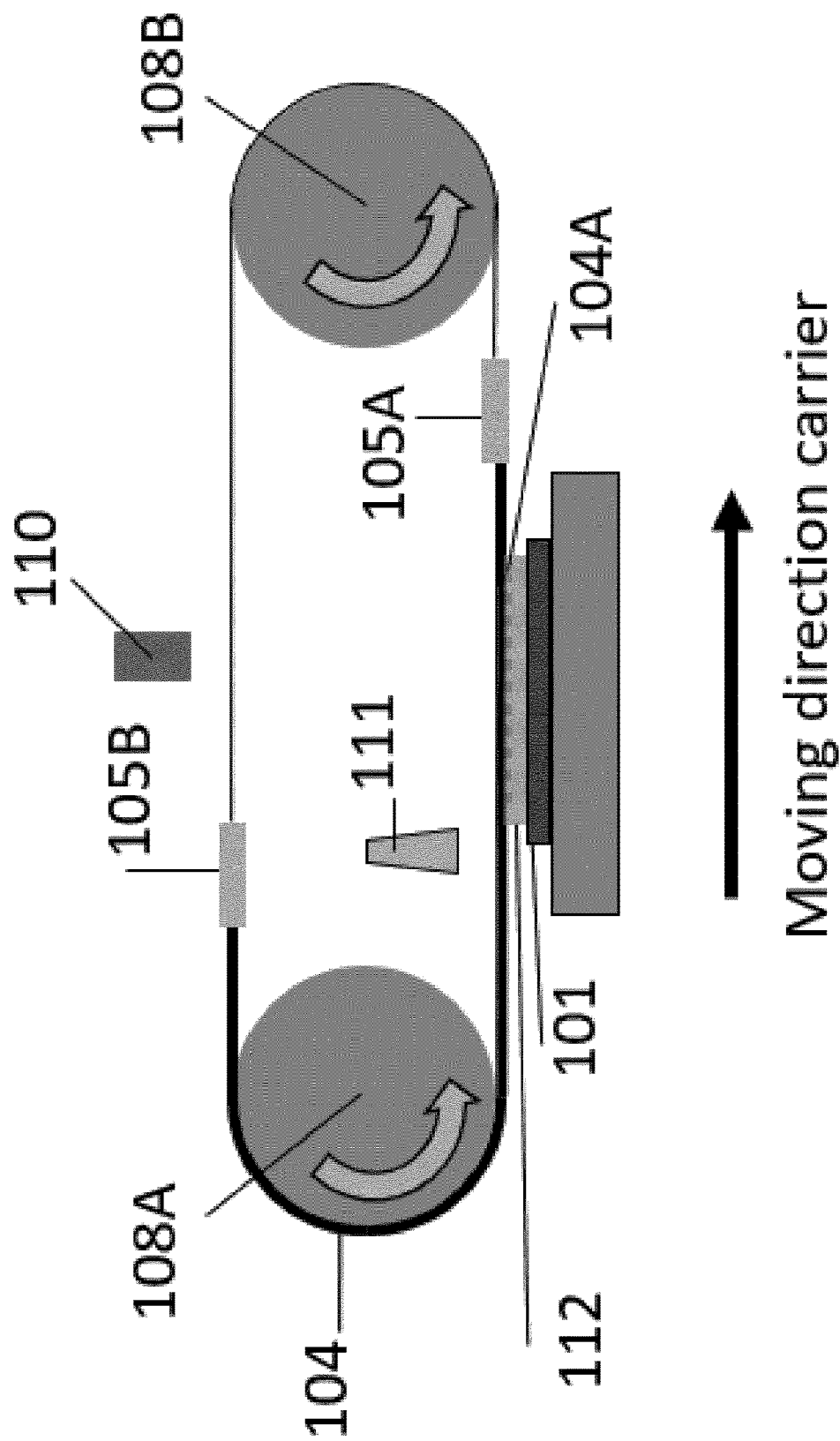
Figure 1B (2): End of UV-curing

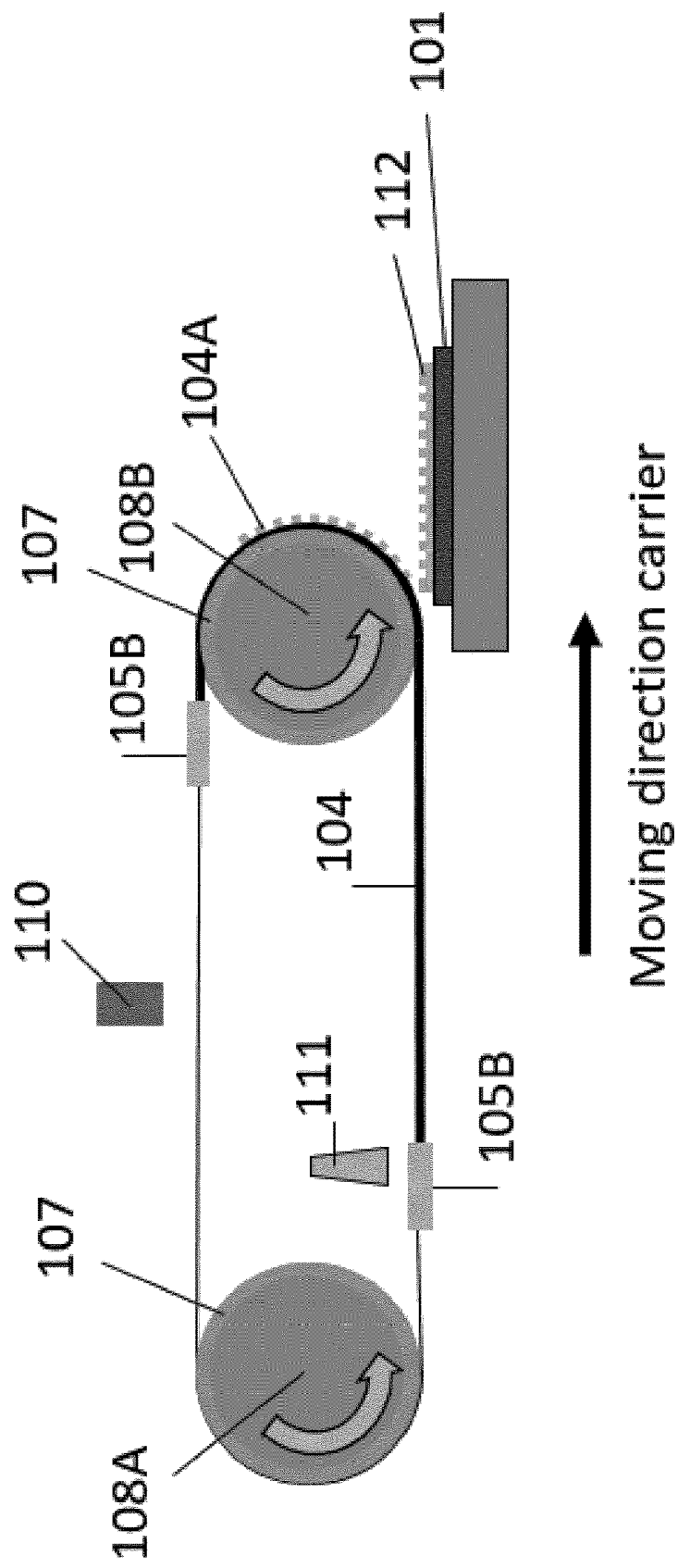
Figure 1B (3): End of delamination flexible stamp

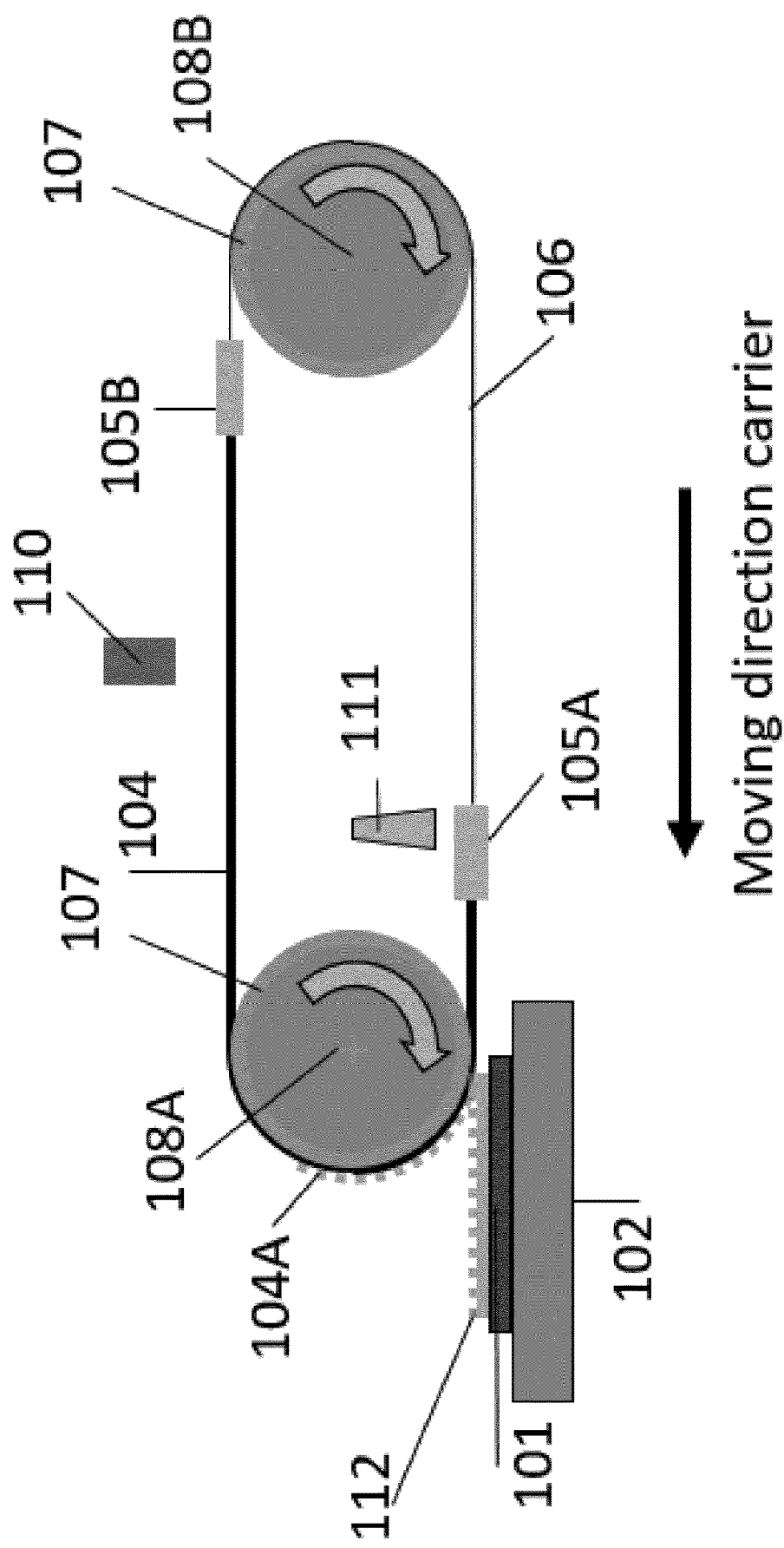
Figure 1B (4): Inverse delamination of flexible stamp

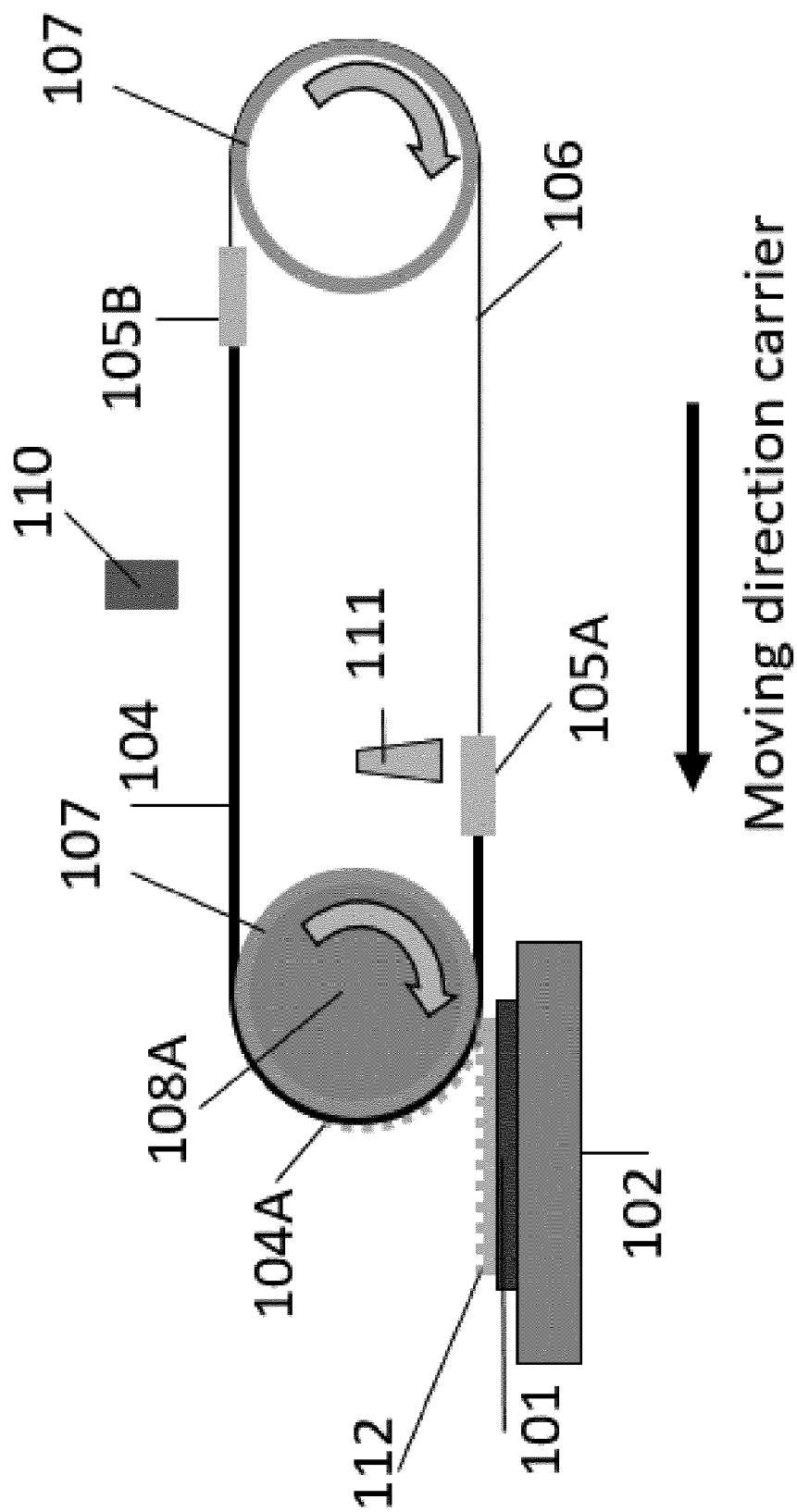
*Figure 1B (5): Inverse delamination of flexible stamp with one roller and two pulleys*

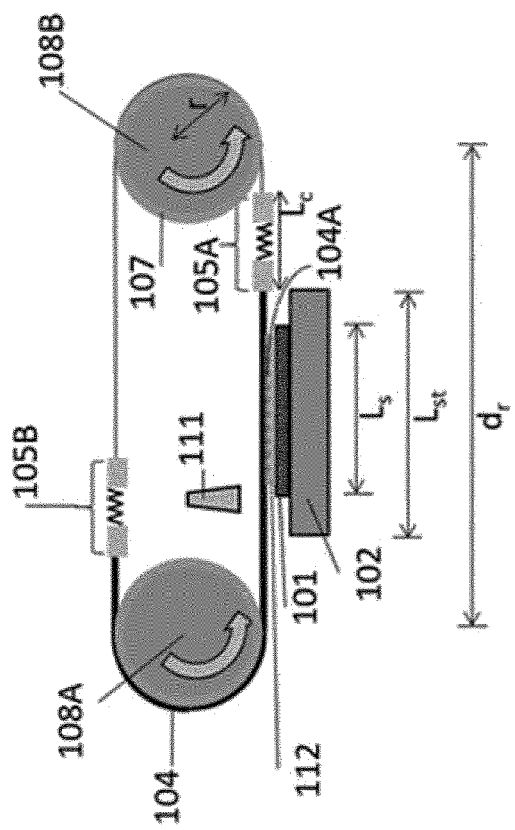
Figure 7(A2)
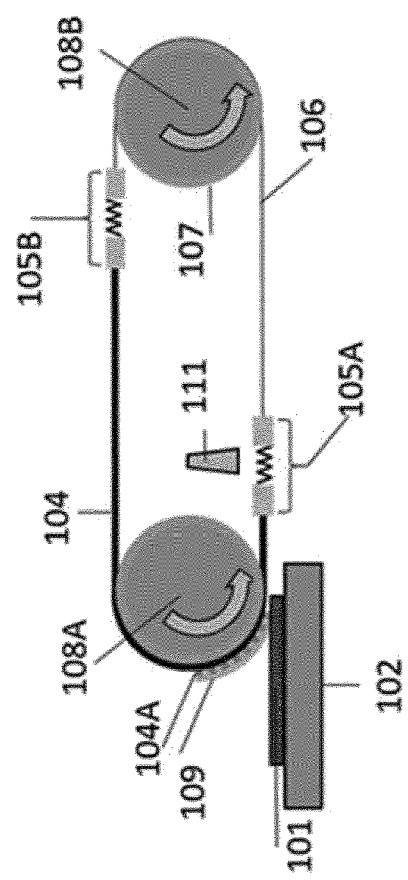
Figure 7A(1)

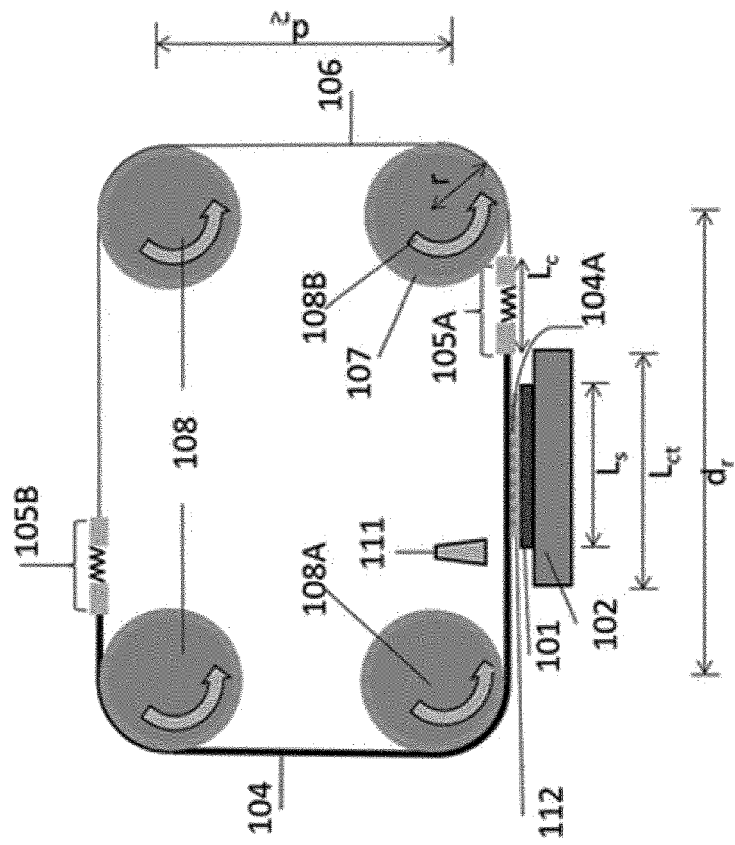
Figure 7B(2)
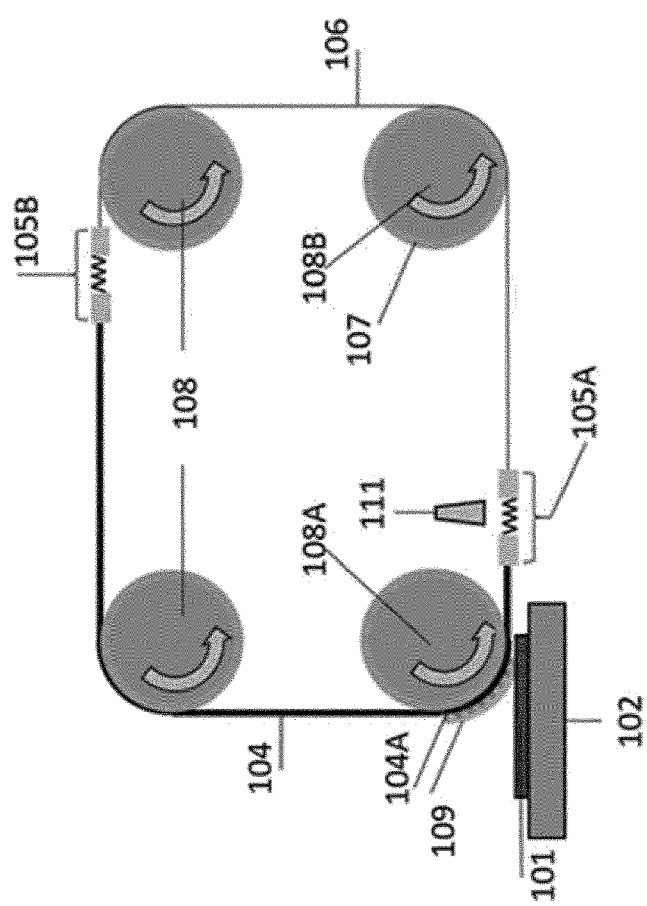
Figure 7B(1)

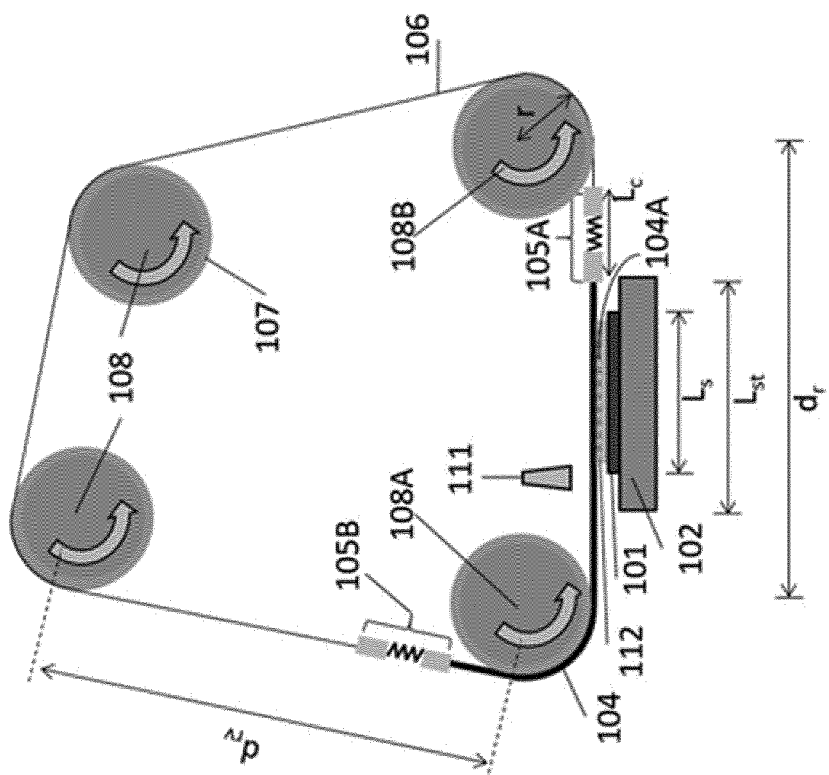
Figure 7C(2)
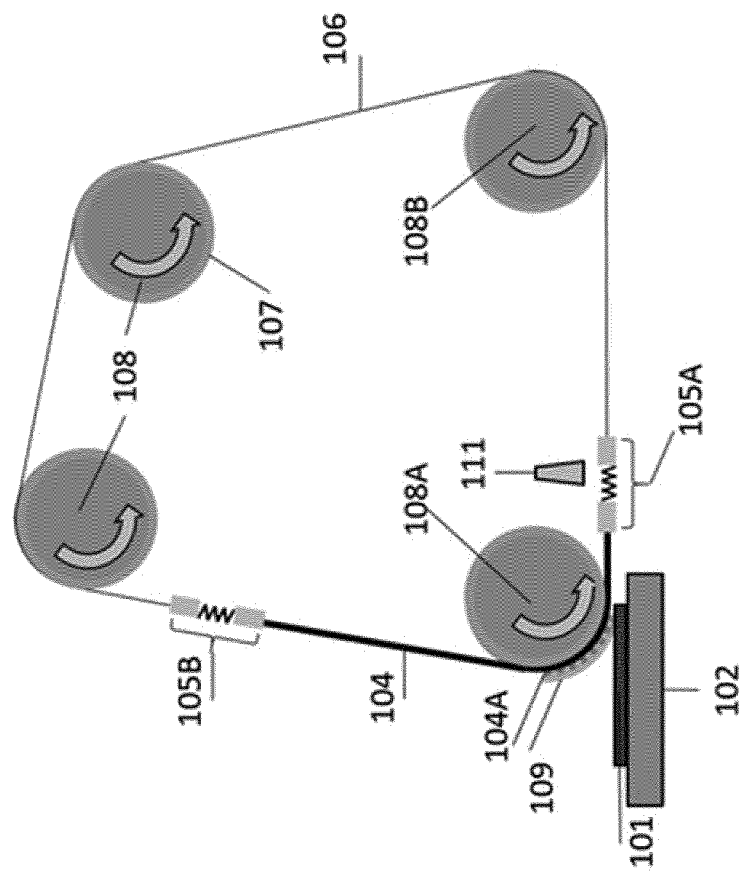
Figure 7C(1)

APPARATUS FOR IMPRINTING DISCRETE SUBSTRATES WITH A FLEXIBLE STAMP

BACKGROUND

The above mentioned plate-to-plate technique is designed for the precise, wafer-scale, imprinting of small textures (feature size of sub-100 nm) on uniform flat wafers with high position accuracy. But as described in the Chinese Patent Application CN 103235483, this technology is difficult to scale to a larger area.

By use of the roll-to-roll technology textured foils can be made continuously at high production speeds. These textured foils can be used as substrates for flexible applications or can be laminated onto rigid substrates. However the latter comes at additional cost of an intermediate adhesive layer to adhere the textured flexible foil to the rigid substrate or product. Therefore a third new technology is being developed: direct roll-to-plate imprinting. Hereby the functional textured layer is directly applied on the discrete substrate without the use of a carrier film that has an additional intermediate adhesive layer of tens to hundreds of microns thickness. In contrast to the plate-to-plate technology the imprint is made by use of rollers which are textured or by use of textured foils, also called flexible stamps, wound around rollers.

The invention pertains to an apparatus for texturing or patterning discrete substrates by imprinting a curable lacquer with a flexible stamp and curing the imprinted lacquer while the flexible stamp is laminated with the curable lacquer on the substrate and subsequently released resulting in an additional functional textured layer on the discrete substrate. The function of this additional layer can amongst others vary from a light management layer to a hydrophobic layer, decorative use or use in biosensors. The invention further pertains to an apparatus as well as a flexible stamp that imprints the lacquer to texture or pattern the discrete substrates.

The use of functional textured layers on devices is an important topic. The smart usage of such layers can enhance performance, reduce cost or improve the visual appearance of the product. For example diffusing layers are used in displays, enabling the use of thinner LED backlight concepts and illuminating the display from the sides. Other new high tech possibilities are the integration of functional textured layers into solar panels improving their efficiency or integration in organic light-emitting diode (OLED) lighting panels to extract more light.

Functional textured layers can be made by use of UV imprinting. In this case the substrate, or stamp, or both are coated with a lacquer (resin or resist). After pressing the stamp on the substrate with lacquer in between, the textured lacquer is cured to a solid phase. The curing method can be thermal or by use of UV light. Already in 1978 this technology was mentioned in U.S. Pat. No. 4,128,369. Further pioneering work was done by Chou in 1995. He demonstrated that by use of a rigid stamp sub-25 nm textures could be replicated at high throughput for mass production (U.S. Pat. No. 5,772,905 or in an article by Stephen Y. Chou, Peter R. Krauss, Preston J. Renstrom (Appl. Phys. Lett. 67 (1995) 3114-3116)). Later-on the use of a roller to apply pressure on either a rigid stamp or a bended thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques.

In the semiconductor industry plate-to-plate imprinting is applied by using a rigid stamp in combination with a transfer process, materials and precise positioning as described in U.S. Pat. No. 6,334,960, U.S. Patent Application 2004/0065976 and U.S. Pat. No. 8,432,548.

The roll-to-roll imprinting technique uses textured rollers in combination with flexible substrates to texture foils or films in a continuous process as described in e.g. the U.S. Pat. No. 8,027,086.

The above mentioned plate-to-plate technique is designed for the precise, wafer-scale, imprinting of small textures (feature size of sub-100 nm) on uniform flat wafers with high position accuracy. But as described in the Chinese Patent Application CN 103235483, this technology is difficult to scale to a larger area. By use of the roll-to-roll technology textured foils can be made continuously at high production speeds. These textured foils can be used as substrates for flexible applications or can be laminated onto rigid substrates. However the latter comes at additional cost of an intermediate adhesive layer to adhere the textured flexible foil to the rigid substrate or product. Therefore a third new technology is being developed: direct roll-to-plate imprinting. Hereby the functional textured layer is directly applied on the discrete substrate without the use of a carrier film that has an additional intermediate adhesive layer of tens to hundreds of microns thickness. In contrast to the plate-to-plate technology the imprint is made by use of rollers which are textured or by use of textured foils, also called flexible stamps, winded around rollers.

In the prior art various types of developed roll-to-plate equipment are described.

WO 2016/012174 A1 describes a lithographic apparatus comprising: an illumination system configured to condition a radiation beam; a rotary drive adapted to move a flexible patterning device along a closed loop trajectory, the closed loop trajectory having a straight portion and a curved portion, a curvature of the flexible patterning device substantially corresponding to a curvature of the closed loop trajectory; a substrate table constructed to hold a substrate; wherein the rotary drive comprises a pulley assembly configured to: engage, during use, the flexible patterning device, and maintain, during use, a portion of the flexible patterning device that is situated along the straight portion of the trajectory substantially flat, the substantially flat portion of the patterning device being configured to impart the radiation beam with a pattern in its cross-section to form a patterned radiation beam, and; a projection system configured to project the patterned radiation beam onto a target portion of the substrate.

The French Patent 2,893,610 uses a textured roller to replicate the required textures. Also a removable flexible stamp can be used as disclosed in the U.S. Pat. No. 7,824,516 and US Patent application 2013/214452. In this case the flexible stamp is wound off and on by use of two rollers. A third possibility is described in U.S. Pat. No. 7,296,519 B2 and patent applications US 2013/214452 A1 and CN 103235483 which propose to use a shorter flexible stamp as mold, which is wound around multiple rollers and can be continuously re-used. Such a shorter flexible stamp can have advantages in the re-usability of the flexible stamp as well as an easier switch to a different imprint pattern.

The use of a shorter flexible stamp as mold does require a different stamp handling compared to the handling of larger stamps wound around an unwinding feed roller and winding collecting roller. The prior art proposes a setup where the flexible stamp is a closed loop. This can be a textured sheet of which both ends can be connected and mounted around the two or more rollers or can be secured along its circumference, as described in U.S. Pat. No. 7,296,519 B2. In the prior art the flexible stamp is moved by the rollers, by use of the friction between the rollers and the flexible stamp. The tension is controlled by controlling the distance of the rollers.

The drawback of using a flexible stamp to replicate a texture by use of rollers in a roll-to-plate imprinting method is that it is difficult to control the tension. Variation of tension exerted on the flexible stamp will affect the dimensions of the stamp and thereby the feature distribution or track-pitch of the texture. For plate-to-plate replication, using a rigid stamp, this is less of an issue. However, a flexible stamp will expand or contract in case of tension variation, as well as in the case of temperature and humidity variation. For an application where an exact match of the replication texture with the product is required, such track-pitch variation will be problematic. An example, but not limited to this application, is the use of lenticular lenses for 3D application, where the lenses should match with the display pixel array. Over a display the maximum track-pitch variation without visual impact is 1 track-pitch of the lenticular array. For a 24 inch display and a 3D lenticular track-pitch of 100 micron, the maximum variation is 100 micron over a length of 500 mm. This specification is even more severe for similar displays with higher resolutions and thereby smaller 3D feature sizes.

If a 10 N tension variation is applied on a polycarbonate flexible stamp with lenticular array texture having a length of 0.5 meter, width of 0.5 meter and thickness of 0.25 mm, the track-pitch of the lenticulars will vary with around 17 micron over the length of the flexible stamp. Besides tension variation, also temperature variation and humidity variation have impact on track-pitch variation. Therefore it is believed that track-pitch variation due to tension variation should be controlled and minimized. For other applications a sudden tension variation can be visually disturbing. Therefore, for high-end applications, tension variation of the flexible stamp while imprinting should be controlled and minimized.

During an imprint process there will always be tension applied on the flexible stamp, to make sure the replication area has a straight, non-bended surface. If this tension is well controlled and thereby constant, the impact of the applied tension on the imprint texture track-pitch can be corrected while making the master. Tension variation is often controlled by use of tension control sensors and by moving one of the rollers outward/inwards, as described in the patent application SG 184034 A1 or U.S. Pat. No. 8,027,086 B2. The drawback of this kind of tension control is that this tension control comes with a delay time. Secondly, the tension is controlled by the surface of the rollers. These rollers steer the movement of the flexible stamp. However, for good imprint quality which requires flexible stamp conformity with a substrate the surface of these rollers can be soft. For large area imprinting such steering has the additional problem that local wrinkling or slipping of the large flexible stamp might occur.

SUMMARY

DETAILED DESCRIPTION

The problem to overcome by the present invention is to provide an apparatus for discrete imprinting with a short flexible stamp in such a way that the apparatus enables a linear movement of the flexible stamp while imprinting, without slipping or wrinkling and with direct control of the stamp tension without a delay time.

Said problem is solved by an apparatus for imprinting on a discrete substrate with a discrete flexible stamp comprising
  a) at least a first flexible rectangular stamp having a length L, a width W, a stamp area $A_{stamp}$, an onset, and an end, wherein the stamp comprises
     a front surface comprising an imprint texture having an imprint area $A_{imprint} \leq A_{stamp}$, wherein the imprint texture has openings and elevations,
     a rear surface,
     an onset areal segment and an end areal segment both extending along the whole width W of the flexible stamp, wherein
     the onset areal segment extends for an onset length $L_{onset}$, and
     the end areal segment extends for an end length $L_{end}$ along the length L of the stamp,
  b) at least a first clamp which clamps the onset areal segment of the flexible stamp and at least a second clamp which clamps the end areal segment of the flexible stamp,
  c) a first roller which is an imprint roller,
  d) at least one driven belt connected with the first clamp and with the second clamp and capable of moving the clamped flexible stamp along its length L and with its rear surface over the imprint roller for an imprinting distance $I_d$ to imprint the imprint texture of the flexible stamp onto a substrate by contacting the front surface of the flexible stamp and the substrate with a lacquer in between so that the lacquer is provided with an imprinted texture replicating an imprinted area A' on the substrate, and wherein the belt is capable to move the stamp in a moving direction, wherein the moving direction either is an imprinting direction or a direction opposite to the imprinting direction, wherein
either the imprint roller is not able to cause its own rotation, but is driven by the stamp which in turn is driven by the belt which in turn is driven by a belt driving device, or the imprint roller is driven at the same speed as the belt by a roller driving device which follows the belt driving device in a master slave configuration.

The apparatus according to the present invention allows a high accurate imprinting of a substrate by use of a flexible stamp. The stamp comprises an imprint texture on its front surface. The apparatus comprises a first roller, which is an imprint roller, wherein the roller either is not able to cause its own rotation, but is driven by the stamp which in turn is driven by the belt which in turn is driven by a belt driving device, or the roller is driven at the same speed as the belt by a roller driving device which follows the belt driving device in a master slave configuration. Within the scope of the present invention this means, that the belt and not the roller determines the movement of the flexible stamp and thereby the speed of replication. Rather, said roller is driven by the at least one flexible stamp which is driven by a belt or by a loosely driven motor which is following the motor of the belt in a master slave configuration. And, the at least one driven belt itself is driven by a suitable belt driving device, e.g. by an electric motor. If the belt, which is connected with the first clamp and with the second clamp moves the clamped stamp along its length L over the roller, said roller is caused to perform a passive rotation. So, not the friction between the flexible stamp and a driven roller moves the stamp over the roller, as it is the case in the imprinting apparatuses of the prior art. Rather, the driven belt moves the clamped stamp over the roller, which can be mounted with low friction bearings.

The connection of the first and of the second clamp with the flexible stamp clamped in between using a certain distance between the clamps on the belt together with the spatial arrangement of the roller relative to the clamped stamp allows to apply a certain tension on the flexible stamp. Said desired tension is maintained during the movement of the stamp in the course of an imprinting process even if the flexible stamp is moved over the roller. This is, because, as explained above, the flexible stamp neither wrinkles nor slips on the roller. So, the apparatus according to the present invention provides a direct control of the stamp tension during imprinting without a delay time in the control-adjustment loop.

Said direct control of the stamp tension without a delay time can be even more improved in a preferred embodiment of the apparatus according to the present invention, wherein at least the first clamp or at least the second clamp is provided with an integrated device for further control and adjustment of the flexible stamp tension, while remaining the operational flexibility of an easy exchange of the flexible stamp.

Yet another advantage of the apparatus according to the present invention is its possibility to use two or more flexible stamps at the same time, wherein each of the stamps may bear a different imprinting texture on its textured surface.

As mentioned above, the apparatus according to the present invention comprises at least one driven belt which is connected with the first and with the second clamp, and which is capable of moving the at least first clamped flexible stamp along its length L.

Preferably, the at least one belt is driven by a motor. The belt is guided by use of guiding rails or pulleys. These pulleys or guiding rails are preferably located at the sides of the at least first roller, which is an imprint roller. If a second roller, third roller or more rollers are used, the pulley or guiding rails are preferably also located at the sides of these additional rollers. The belt determines the rotation of the flexible stamp and thereby the speed of imprinting. The roller can be driven at the same speed as the belt in a master slave configuration, following the belt. This can for instance be achieved, if the roller is friction-locked with the pulley. The roller can also be "non-driven", i.e., not being able to cause its own rotation, and can be friction-locked with the flexible stamp, which is mounted by use of clamps on the belt. The roller can also be friction-unlocked with the flexible stamp.

In preferred embodiments the apparatus may further comprise a third clamp, a fourth clamp and even more clamps connected on the same belt, wherein, for example, a first flexible stamp may be clamped between a first and second clamp, a second flexible stamp may be clamped between a third and a fourth clamp, and a third flexible stamp may be clamped between a fifth and a sixth clamp. This reduces the cycle time and allows a higher throughput during imprinting. In each of the embodiments mentioned above more than one flexible stamp may be clamped between a required number of clamps. This furthermore can increase the throughput of the apparatus.

Preferably, the apparatus according to the present invention comprises two, three, or even more than four belts. In any case, the at least one driven belt serves as a guiding support for the clamps, preferably such guiding supports are present at both sides of each clamp.

In a further preferred embodiment the apparatus according to the present invention comprises a first pair of belts, a second pair of belts or even more pairs of belts, wherein each of the first, second, third or even more pairs of belts can be steered independently from one another. For example, one pair of belts may move a clamped flexible stamp through a desired process step, e.g. through imprinting or through coating with the lacquer, while another pair of belts with another clamped flexible stamp may stop moving or reverse the moving direction. This allows for an increase in flexibility, a reduction of the cycle time and an increase of the throughput of the imprinting process.

In a further preferred embodiment the apparatus according to the present invention comprises at least a first flexible stamp clamped between a first clamp and a second clamp, wherein the first clamp and the second clamp are connected with a first pair of belts, and wherein the apparatus further comprises at least a second flexible stamp clamped between a third clamp and a fourth clamp, wherein the third clamp and the fourth clamp are connected with a second pair of belts, and wherein the first pair of belts can be steered independently from the second pair of belts.

In a further preferred embodiment the apparatus according to the present invention may comprise a third clamp, a fourth clamp and even more clamps connected on the same belt, wherein, for example, a first flexible stamp may be clamped between a first and a second clamp, a second flexible stamp may be clamped between a third and a fourth clamp, and a third stamp may be clamped between a fifth and a sixth clamp. This reduces the cycle time and allows a higher throughput during imprinting.

In a further preferred embodiment the apparatus according to the present invention comprises at least a first stamp clamped between a first clamp and a second clamp, wherein the first clamp and the second clamp are connected with a first pair of belts, and wherein the apparatus further comprises at least a second stamp clamped between a third clamp and a fourth clamp, wherein the third clamp and the fourth clamp are connected with the same first pair of belts, and wherein two or more stamps are transported simultaneously.

In a further preferred embodiment of the apparatus according to the present invention, wherein at least the second clamp comprises a clamp connector, it is preferred that the clamp connector pins the clamp on the at least one driven belt by use of clamp connector pin, and the stamp holder which holds the flexible stamp is preferably a sheet, rail, bar or cylinder on or in which the stamp is fixed.

In a further preferred embodiment of the apparatus according to the present invention at least the second clamp comprises a connector which pins the clamp on the at least one driven belt, i.e., a clamp connector, and a flexible stamp holder which holds the flexible stamp.

In a further preferred embodiment of the apparatus according to the present invention, wherein at least the second clamp comprises a flexible stamp holder, the clamp holds one or more flexible stamps, wherein the stamps have the same length and the same or a different width. If in this preferred embodiment the stamp holder holds two, three or even more flexible stamps, the different flexible stamps can have the same or a different imprint texture on its textured surface, or the same or different imprint texture area dimensions. In any case, the stamp holder allows an easy removal of the one or more flexible stamps.

In an especially preferred embodiment of the apparatus according to the present invention the clamp connector comprises an easy mounting part, which ensures easy placement and removal of the stamp holder on and off the belt, and wherein the mounting part optionally comprises a clamp base and tension control springs.

In a further preferred embodiment of the apparatus according to the present invention the first and/or the second clamp comprises a flexible stamp alignment pin which can adjust the position of the flexible stamp and the stamp holder relative to the position of the clamp connector on the belt.

In a further preferred embodiment of the apparatus according to the present invention the first and/or the second clamp comprises a stamp holder position alignment pin which adjusts the distance between the stamp holder and the position of the clamp connector on the belt, whereby the stamp holder will be moved in perpendicular direction relative to the movement direction of the belt.

In a further preferred embodiment of the apparatus according to the present invention, wherein at least the second clamp comprises a flexible stamp holder, the clamp holds one or more flexible stamps, wherein the stamps have the same length and the same or a different width. If in this preferred embodiment the stamp holder holds two, three or even more flexible stamps, the different flexible stamps can have the same or a different imprint texture on its textured surface, or the same or different imprint texture area dimensions. In any case, the stamp holder allows an easy removal of the one or more flexible stamps.

In a further preferred embodiment of the apparatus according to the present invention the stamp holder holds one or more flexible stamps, wherein the stamps have the same length and the same or a different width.

In a further preferred embodiment of the apparatus according to the present invention at least the second clamp is provided with an integrated device for control and adjustment of the flexible stamp tension, and wherein the device comprises a material or component which is capable to act as a spring, and which controls and adjusts the flexible stamp tension, wherein, preferably, the material is a flexible material and the component is a flexible component.

Preferably, the material which optionally is a flexible material comprises one or more springs.

In a preferred embodiment of the apparatus according to the present invention a tension of the flexible stamp is controllable by adjusting the length of the springs mentioned above, or by adjusting the distance between the first and second clamp with flexible stamp in between.

The one or more springs preferably comprise spiral springs, leaf springs, rotational springs, or tension springs.

In an especially preferred embodiment of the apparatus according to the present invention the one or more springs comprise spiral springs, leaf springs, rotational springs, or tension springs, and the tension of the flexible stamp is controllable by the tension of the springs either by adjusting the length of the springs and/or the distance of the clamps and/or adjusting the spring constant.

In a further preferred embodiment of the apparatus according to the present invention the clamp comprises one or more guiding pins in between the stamp holder and a clamp base, which ensures that the stamp holder with integrated tension control device can only move in the same or opposite direction as the belt movement.

In a further preferred embodiment the material comprises one or more rubber sheets. Said one or more rubber sheets are capable to act as a spring, and are able to control and adjust the flexible stamp tension variation.

In a further preferred embodiment of the apparatus according to the present invention at least the second clamp comprises one or more additional guiding pins, which guide the movement of the stamp holder in the same or opposite direction as the belt movement.

In a further preferred embodiment of the apparatus according to the present invention a distance $d_{cv}$ between a mounting opening of a stamp holder and a base of a clamp is below 5 cm, preferably <3 cm, more preferred <2 cm, and most preferred 0 cm.

In a further preferred embodiment of the apparatus according to the present invention a distance $d_{ch}$ between the mounting opening of the stamp holder and a pivot position of the clamp on the belt is below 5 cm, preferably <3 cm, more preferred <2 cm, and most preferred 0 cm.

In a further preferred embodiment of the apparatus according to the present invention the stamp has
an onset areal segment with an onset length $L_{onset} \geq L_{cm}$,
wherein $L_{cm}$ is the minimal length which is required for the mounting of the stamp in the mounting opening of the stamp holder,
a middle imprint areal segment with a length $L_{middle} \geq L_s$, wherein $L_s$ is a length of the substrate, and
an end areal segment with an end length $L_{end} \geq L_{cm} + \frac{1}{4} \cdot r$, wherein r is a radius of the imprint roller,
and wherein a maximum length of the stamp is $L_{max} \leq L_b$, wherein $L_b$ is a length of the belt.

In another preferred embodiment the apparatus further comprises a substrate arranged on a carrier, wherein the carrier is driven in a master slave configuration with at least one driven belt with the flexible stamp mounted by use of a clamp on the belt.

Preferably, the carrier is arranged with at least one gliding element, so that the carrier is able to glide along the gliding element. For example, the at least one gliding element may comprise two rods which bear the carrier, and along which the carrier is able to glide in order to allow the carrier to be loosely driven in a master slave configuration with the flexible stamp mounted by use of a clamp on the belt.

Preferably, the flexible stamp has a supporting flexible stamp base and a textured outer surface, wherein the flexible stamp base and the textured outer surface can be made of one and the same material, as for instance—but not limited to—thin metal sheets or plastic sheets made by a milling or hot embossing process. The flexible stamp can also be made using two or more materials which have a flexible sheet to form the base, as for instance but not limited to PET foil, PC foil, PEN foil, PMMA or other acrylic foil, or thin metal sheets, and an adhered textured organic layer, as for instance but not limited to an acrylate material, a sol-gel material, an epoxy or second textured plastic foil. Even more layers can be added to enhance robustness or functionality of the flexible stamp, as for instance an anti-stick layer.

Preferably, the flexible stamp exhibits a textured surface with a textured surface area TSA, wherein TSA is equal to or larger than the required imprinted area A' on the substrate.

With the apparatus according to the present invention an imprinting process can be performed, wherein the lacquer may either be coated onto the substrate, also called panel, or on the front surface of the flexible stamp comprising the imprint texture. These substrates or panels can be sub-assemblies as for instance glass, plastic or metal substrates or can be finished devices such as displays, lighting or solar panels.

Subsequently, the substrate is imprinted (also called replicated or textured) by contacting the front surface of the flexible stamp and the substrate with lacquer in between. The lacquer is capable of being cured to retain the imprinted pattern.

In the course of the present invention the term "lacquer" means a substance that can be coated onto a substrate and textured (imprinted) by methods known to those skilled in the art. Such lacquers are also referred to as coatings, resins, resists and the like. The lacquer usually comprises monomers, oligomers, with possibly added photo-initiators and crosslinking acrylate groups. Other possible materials are—but not limited to—curable sol-gels and epoxies. These curing processes are also known and encompass thermal curing, curing by UV light, chemically induced curing and other methods known per se.

Therefore, the apparatus according to the present invention preferably comprises a curing device, which for example is capable to perform thermal curing, curing by UV light, or chemically induced curing. The curing device serves to cure the imprinted lacquer to retain the imprinted pattern.

After curing the flexible stamp is released from the substrate and the inverse texture remains on the substrate.

Coating of the lacquer can be done in various ways, such as—but not limited to—dispensing, ink-jet printing, screen printing, jetting, spraying, slot-die coating or roll-coating the lacquer onto the substrate or onto the flexible stamp.

Preferably, the apparatus according to the present invention comprises an extra curing device for pre-curing the lacquer, before imprinting is performed, for example in order to increase the viscosity of the lacquer to a desired value. Said extra curing device is capable to perform thermal pre-curing, pre-curing by UV light, or chemically induced pre-curing for a desired pre-curing extend.

In the following further preferred embodiments of the apparatus according to the present invention are described and illustrated by figures.

FIG. 1A shows a preferred embodiment of a roll-to-plate imprint apparatus according to the present invention in which a flexible stamp of limited size is hold by use of two clamps.

In this apparatus a substrate 101 will be imprinted. This substrate is supported by use of a carrier 102. In FIG. 1A this carrier 102 is a gliding substrate table. Other support means can be used like for instance—but not limited to—a conveyor belt or transport rollers. This carrier 102 can glide underneath of the imprint roller 108A, by use of two gliding devices 103. If the carrier 102 with substrate is moved to the right, as shown in FIG. 1A by the arrow depicting the imprint direction, the substrate 101 will be imprinted. The substrate 101 is imprinted by use of a textured foil 104. As shown in the FIG. 1A this textured foil 104 acts as a flexible stamp, which is therefore called flexible stamp. The flexible stamp 104 has a supporting flexible stamp base and a patterned front surface 104A, also referred to as "the imprint texture" or "the imprint pattern". This imprint texture 104A comprises a functional area which for the ones skilled in the art is known as relief pattern. This relief patterned front surface 104A is the negative (or inverse) texture of the desired texture on the substrate. The flexible stamp base 104 and the textured front surface 104A can be made of one and the same material, as for instance—but not limited to—thin metal sheets or plastic sheets made by a milling or hot embossing process. The flexible stamp 104 can also be made using two or more materials which have a flexible sheet as base, like for instance but not limited to PET foil, PC foil or PEN foil, PMMA or other acrylic foil, and an adhered textured organic layer 104A, like for instance but not limited to an acrylate material, a sol-gel material, an epoxy, silicone material as for instance PDMS or second textured plastic foil. Even more layers can be added to enhance robustness or functionality of the flexible stamp 104, as for instance an anti-stick layer. In FIG. 1A the imprint pattern area 104A is smaller than the area of the flexible stamp base, i.e., smaller than the area of the stamp 104. However, it is also possible that the full area of flexible stamp base 104, i.e. the full area of the stamp 104 has a relief pattern 104A.

Preferably, the flexible stamp 104 exhibits a Young's Modulus between 0.1 Giga Pascal (GPa) and 10 Giga Pascal (GPa), especially preferred between 0.5 Giga Pascal (GPa) and 5 Giga Pascal (GPa). The Young's Modulus was measured according to ASTM E111.

This flexible stamp 104 is held in place by use of a first clamp 105A and a second clamp 105B, as shown in FIG. 1A. Clamp 105A is the front clamp, in which the onset areal segment of the flexible stamp in respect to the imprint direction is mounted. The end areal segment of the flexible stamp is mounted in clamp 105B. The clamps are mounted on the belt 106. The material of the belt 106 can be for example, but not limited to, polyurethane with stainless steel tension members. Although one or more belts are in principle possible, it is mostly preferred to use two belts 106, as guiding supports for each of the clamps 108A and 108B, preferably at both sides of the said clamps. In FIG. 1A the belts 106 are guided by guiding elements 107 which are located at the sides of the rollers 108. These guiding elements 107 can be pulleys, as shown in FIG. 1A. The belt 106 can be driven by one of the pulleys 107 or by use of an additional motor, placed in between the rollers. The rotation speed of the belt can be between 0.05 m/min to over 30 m/min. The tension of the belt can be controlled by moving the pulley inwards or outwards. Preferably the speed is between 0.5 m/min and 15 m/min. In FIG. 1A four rollers 108 are shown. But it is also possible to use two, three or more than four rollers. The four rollers 108 shown in FIG. 1A will guide the clamped flexible stamp 104. The roller 108A is the roller by which the actual imprinting process will take place. The roller 108B is the roller by which the delamination of the flexible stamp from the substrate 101 with cured textured lacquer will take place. The rollers 108 can be made of a rigid material as for instance but not limited to, stainless steel, but preferably the rollers are made of a more elastic material as for instance, but not limited to, polychloroprene, polyurethane or EPDM with a shore-A hardness of between 10 and 100, preferably between shore A-hardness of between 20 to 60.

The rollers 108 are "not driven", i.e., the rollers 108 are not able to cause their own motion and are free to rotate in any direction, but are driven by the stamp 104 which in turn is driven by the belt 106 which in turn is driven by a belt driving device, or the rollers 108 are driven at the same speed as the belt by a roller driving device which follows the belt driving device in a master-slave configuration. So, the belt 106 is driven. The carrier 102 is driven in a master slave configuration with the belt 106. During imprinting the belt 106 with clamps 105A and 105B and flexible stamp 104 will be in contact with the substrate 101 and curable lacquer 109 in between. Therefore, during imprinting, the carrier 102 with substrate 101 will follow the driven belt 106 in a master slave configuration. The diameter of the rollers 108 and pulleys 107 are similar, in such a case that during imprinting the imprint roller 108A will be in contact with the flexible stamp 104 and can press the flexible stamp 104 on the substrate 101.

Prior to the imprinting process the substrate 101, which may be a glass substrate, or the flexible stamp 104 or both are coated with the imprint lacquer 109. In FIG. 1A the flexible stamp 104 is coated with the imprint lacquer 109 by use of dispensing means 110. As already mentioned, other techniques can be used for coating. Note that FIG. 1A is a schematic drawing. In real operation the lacquer will be coated on the imprint texture area 104A. Optionally, the lacquer 109 after having been dispensed on the stamp 104 may be pre-cured.

After coating and possibly pre-curing of the imprint lacquer 109 the imprint process starts as shown in FIG. 1B, which top down contains FIG. 1B(1), FIG. 1B(2), FIG. 1B(3), FIG. 1B(4), and FIG. 1B(5). At the start of the imprint process the flexible stamp 104 with imprint texture 104A and imprint lacquer 109 on top is brought in contact with the substrate 101. The movement of the stamp 104 is steered by the pulleys 107 and the belt 106 on which the flexible stamp 104 is mounted by use of clamps 105A and 105B. By sliding the substrate 101 underneath of the imprint roller 108A, as shown in FIG. 1B(1), the flexible stamp 104 is laminated on the substrate 101 with imprint lacquer 109 in between. The imprint lacquer 109 in between the flexible stamp 104 with imprint texture 104A and substrate 101 is hardened by UV light source 111, resulting in cured texture 112, also named imprinted area A', as shown in FIG. 1B(2). In the FIG. 1B the position of the UV light source 111 is placed in between the imprint roller 108A and the roller 108B above the substrate. The UV light source 111 can also be placed in one of the two rollers 108A and 108B. In the case of a transparent substrate 101 and a UV-transparent carrier 102 the UV light source 111 can also be placed underneath of the carrier 102. This can have the advantage of the ability to use a non-transparent mold for the flexible stamp 104, as for instance a thin metal sheet. After solidifying of the imprint lacquer 109, the flexible stamp 104 has to be delaminated from the substrate 101, leaving the cured texture 112 on the substrate 101. This is obtained because the cured texture 112 has better adherence to the substrate 101 than the flexible stamp 104. After delamination of the cured texture 112, the inverse relief texture, compared to the imprint texture 104A, will remain at the substrate 101 and the flexible stamp 104 can be re-used. For delamination, as shown in FIG. 1B(3), it is most easy to further rotate the belt 106 and separate the flexible stamp 104 from the cured texture 112 on substrate 101 by use of the delamination roller 108B. A different option is to roll the belt 106 backwards as shown in FIG. 1B(4). In this case the roller 108A is used for reversed delamination. This alternative process can have the advantage that the clamp, with upstanding edges, does not have to pass the coater. Another advantage is that the second roller for delamination is not needed. This will reduce costs of the apparatus as shown in FIG. 1B(5).

In FIG. 1A and FIG. 1B a roll-to-plate imprint apparatus is shown, using two belts 106 having two clamps 105A and 105B carrying a flexible stamp 104. A drawback of the proposed imprint equipment as shown in FIG. 1A is that the process time is determined by a sequence of two steps. First the stamp 104 is coated by dispensing means 110, subsequently the flexible stamp 104 is used for imprinting underneath of the imprint roller 108A. To increase the throughput several modification to the apparatus are proposed, as shown in FIGS. 2A, 2B and 2C.

The throughput is increased if more substrates are imprinted by the same time unit. This can be realized by tiling substrates 101 and using a wider flexible stamp 104. In this case also the guiding imprint roller 108A should be wider. An example is that one wide flexible stamp 104 with a double imprint texture area 104A is used to imprint two substrates laying side by side. Flexibility is gained with two clamps 105A and 105B which hold two or more flexible stamps 104 with same length as shown in FIG. 2A. The imprint texture 104A of both flexible stamps 104 can be the same or different. The means of coating 110 can be adjusted, if a different imprint lacquer 109 is required for one of the two imprint textures 104A.

FIG. 2B shows a preferred embodiment, showing an apparatus using a first flexible stamp 104 clamped between first clamp 105A and second clamp 105B, and a second flexible stamp clamped between a third and a fourth clamp. Both first and second clamps 105A and 105B and the third and fourth clamp are mounted on and steered by the same belt 106. Throughput is gained, because the coating by dispensing means 110 of the second flexible stamp and imprinting steps of the first flexible stamp 104 underneath imprint roller 108A are not sequential, but can be applied simultaneously. This proposed setup will work best if the coating step and the imprinting step have the same and continuous speed of the belt 106. If the rotation of the belt 106 has to be stopped it is preferred that the second flexible stamp is not imprinting. Either the coating procedure and/or the clamp position can be optimized to enable double or triple imprinting in one belt cycle, using the same apparatus.

FIG. 2C shows a preferred embodiment, showing an apparatus using more clamps which are mounted and steered by two different belts, which are both independently driven. As shown in FIG. 2C the belts are guided by different pulleys 107A and 107B. Throughput is gained, because the coating by dispensing means 110 and imprinting steps underneath imprint roller 108A are not sequential, but can be applied simultaneously, because of the same reasons as already explained in FIG. 2B. Moreover because a first pair of inner belts moves the first clamped stamp 104 over the rollers, and a second pair of outer belts is used to move the second clamped stamp over the rollers, and because the inner pair of belts can be steered independent from the outer pair of belts, the coating and imprinting steps are not necessarily interdependent. For example, the first pair of belts can stop for coating the first clamped stamp 104, while the second pair of belts can continue imprinting the second clamped stamp.

The tension exerted on the flexible stamp will determine the length and width of the stamp while imprinting. Therefore, tension variation will result in a varying track-pitch of the relief pattern. For instance the track-pitch of a lenticular array will vary or a pyramid or lens shape will become broader/smaller. In both cases the tension variation has also an impact on the height of these textures. Furthermore, the overall texture image will be distorted due to the stamp length and width change. The tension exerted on the flexible stamp can change for different reasons. Among others, root causes are:

Un-roundness of the pulleys 107 or rollers 108, resulting of a varying distance between both clamps 105A and 105B;

Forces on the flexible stamp 104 that arises, when a rigid clamp 105 passes a roller 108;

Temperature or humidity variation;

The impact of tension variation on the length of the flexible stamp 104 can be calculated with the formula: $\Delta L = L0 * 1/E * \sigma$. In this formula $\Delta L$ is the deformation of the flexible stamp 104 due to the applied load, L0 is the original length of the flexible stamp, E is the modulus of elasticity and $\sigma$ is the stress on the flexible stamp 104. This stress is defined as the ratio of applied load (or force) to the cross-sectional area of the flexible stamp (width*thickness of the flexible stamp). If tension is applied on the stamp, also the width of the flexible stamp will change. The change in the width of the flexible stamp can be calculated using the Poisson's ratio.

The design of the clamps, the design of the flexible stamp and/or the design of the apparatus can be optimized to reduce the tension variation. In the following different modifications are discussed which can be applied separately or which can be applied together into the apparatus according to the present invention.

FIG. 3A shows a further preferred embodiment of the apparatus according to the present invention, wherein a clamp of the apparatus is schematically drawn. FIG. 3A shows a flexible stamp 104, which is mounted in a clamp 105. The clamp 105 can be the front clamp 105A or back clamp 105B as shown in FIG. 1A. This clamp 105 consists of different parts;

The connector 207 of clamp 105, i.e., the clamp connector 207, pins the clamp 105 by use of belt connector pin 210 on the belt 106. This clamp connector 207 can be permanently fixed on the belt 106. Alternatively, the clamp connector 207 can be designed to enable easy mounting and removal of the stamp holder 206 from the belt 106. The belt connector pin 210 can be a screw or any other connecting pin. The position of this belt connector pin 210 will be the pivot point of the clamp 105 while passing a roller, if one pin is used to connect the clamp on the belt. Therefore the position of this belt connector pin 210 relative to the stamp holder 206 will determine how the clamp 105 and flexible stamp 104 rotate around a roller 108. The stamp holder 206 will hold the flexible stamp 104. This stamp holder 206 can be any holder holding the flexible stamp 104. As an example—but not limited to—the stamp holder 206 can be a sheet, rail, bar or cylinder on or in which the flexible stamp 104 is mounted.

In a preferred embodiment the distance between the stamp holder 206 and the clamp connector 207 can be adjusted. By adjusting this distance, the position of the stamp holder 206 will be moved perpendicular to the rotation direction of the belt 106. This can be done by use of a stamp holder position alignment pin 211. As an example, but not limited to, this stamp holder position alignment pin 211 can be a screw or screw thread possibly in combination with guiders. By adjusting the position of the stamp holder 206, the position of the stamp 104 relative to the substrate 101 is altered. This will enable a fine-tuning of the position of the cured texture 112 on the substrate 101 in vertical direction, along the width of the substrate 101.

There are different ways to mount the flexible stamp 104 in the stamp holder 206. An example is to provide a stamp mounting opening 205 in which the onset areal segment or the end areal segment of the flexible stamp 104 can slide, and wherein said segment of the stamp 104 can be clamped with for instance screws 204.

Another method is to make the stamp holder 206 of two parts which are pressed together with a stamp in between. This stamp holder 206 can hold one flexible stamp 104. The width of a flexible stamp 104 can vary. The clamp 105 can also hold two or more flexible stamps 104 with same or different width and which all have the same length compared to each other. Moreover with a simple holding mechanism, as for instance a screw or a clamp 204, the mounting or change of a flexible stamp 104 will take minimal time. Moreover, this stamp holder 206 can have alignment features to position the flexible stamp 104.

The basic clamp design as shown in FIG. 3A will enable the use of small stamps together with a simple stamp exchange. However this basic clamp design does not have tension control.

FIG. 3B shows a clamp 105 with tension control. In this case a clamp base 208 is added as well as tension control springs 209. The clamp base 208 is used for robustness and stiffness of the clamp 105. If further stamp tension control is required by the apparatus according to the present invention, it is proposed that the clamp base 208 and stamp holder 206 are connected by use of tension control springs 209. This can be one or more springs, like for instance—but not limited to—spiral, leaf springs, rotational springs, tension springs or any other flexible material acting as a spring 209 like for instance—but not limited to—rubber sheets or perforated rubber sheets. Preferably the tension of the springs 209 can be controlled to compensate for differences in length of the flexible stamp 104.

As show in FIG. 4A the tension can be manually adjusted by use of a screw 303 which can alter the length of the tension control springs 209. Other possibilities to control are for instance, but not limited to, the winding/unwinding of the spring 209, by altering the position of the clamp connector 207 with belt connector pin 210 on the belt 106 or by adjusting the spring constant. The applied tension can be offline or inline determined with use of a force meter.

Because a spring array 209 might bend to all directions, for instance downwards or aside, an additional guiding pin 304 can be added, which ensures that the stamp holder 206 can only move in the same or opposite direction as the belt 106 movement. It is important to guide this pin in a low friction bearing in order to prevent slip-stick effects.

FIG. 4A shows a preferred embodiment in which the clamp connector 207 is designed to enable easy mounting as well as easy removal of the stamp holder 206 from or on the belt 106. If a clamp base 208 and tension control springs 209 are integrated in the clamp, it is preferred that the clamp base 208 and tension control springs 209 are mounted and removed together with the stamp holder 206 from the belt 106. As an example, but not limited to, the clamp connector 207 can hold the clamp base 208 and thereby the stamp holder 206 by use of clamps 207A as shown in FIG. 4A. These clamps 207A can be moved aside for easy mounting and removal of the clamp base 208 and the stamp holder 206, holding the stamp. In another example, but not limited to, the clamp connector 207 is spilt in two parts, of which one is fixed on the belt and the other part is permanently fixed on the stamp holder 206 or stamp base 208. Both parts of the clamp connector 207 can be connected by sliding one part underneath a hook mounted on the other part.

With the stamp holder position alignment pin 211 the distance of the stamp holder 206 to the clamp connector 207 can be controlled. If a clamp base 208 and tension control springs 209 are integrated in the clamp 105, as shown in FIG. 4A, the position of the stamp holder 210 can also be altered by altering the distance of the clamp base 208 to the clamp connector 207 by use of the stamp holder position alignment pin 211. In both cases the position of the stamp holder 206 is altered perpendicular to the rotation direction of the belt 106. In this manner, the position of the flexible stamp 104 relative to the substrate 101 and thereby the position of the imprint area $A_{imprint}$ on the substrate 101 can be optimized.

There are different possibilities to connect a stamp holder 206, holding the flexible stamp 104, to the belt 106 with a tension control spring 209 in between. Among other options, an example is to place the springs 209 in between of the clamp connector 207 and the belt 106 as shown in FIG. 4B. In this case the stamp holder 206 and clamp base 208 can be the same.

To further control the stamp tension, both the front clamp 105A and back clamp 105B, as shown in FIG. 1A, can have tension control springs 209 as shown in FIG. 3B. From both the front clamp 105A and back clamp 105B the tension control of the back clamp 105B is most effective. After curing the first part of the texture 104A, at the first contact between the substrate 101 and flexible stamp 104 with curable lacquer 109 in between, the tension control of the front clamp 105A will not be effective anymore. Moreover, due to varying lengths of the springs in the front clamp 105A the imprinting start position is less well defined. Therefore it is preferred that the front clamp 105A has the basic clamp design as shown in FIG. 3A, and does not have tension control springs as shown in FIG. 3B.

FIG. 5 illustrates the effect of the weight of clamp 105B on the tension of the flexible stamp. Depending on the position of the back clamp 105B and/or front clamp 105A during imprinting, the weight of the clamp 105 can have an impact on tension variation which is exerted to the flexible stamp 104.

As shown in FIG. 5, if the clamp 105B is rotated from horizontal position to vertical position, the forces acting on the flexible stamp 104 will change. In horizontal position, as shown on the left side of FIG. 5, the tension control spring 209 will pull the flexible stamp holder 206 of the back clamp 105B with a force of for instance 100 N. If the same back clamp 105B is rotated to vertical position, as shown on the right side of FIG. 5, the spring 209 will pull with the same force of 100 N. However, gravity will pull the flexible stamp holder 206 downwards along the field lines of gravity. For a flexible stamp holder 206 with a weight of 3 kilogram, the tension on the flexible stamp will be reduced with 30 N. Depending on the dimensions of the flexible stamp 104, a tension variation of 30 N is applied to the flexible stamp 104 while imprinting, and said tension variation will affect the quality of the imprint texture. To reduce this impact, the weight of the flexible stamp holder 206 should be minimal. As an example, the weight of a clamp 105 is preferably below 5 kg for a clamp 105 with a width of 600 mm.

FIG. 6A shows a further preferred embodiment of the apparatus according to the present invention, wherein the clamp 105B is rotated around roller 108A. The minimum width of the clamps 105A and 105B is determined by the distance of the two belts 106 which are shown in FIG. 1A. The length and the height of the clamp 105B should be minimized to limit the impact on the stamp tension variation once the clamp 105B is rotated around the roller 108A. As shown in FIG. 6A the tension on the flexible stamp 104 will be altered during imprinting once the clamp 105B is rotated around roller 108A. Note that the same effect is present if the front clamp 105A is rotated around roller 108B, according to FIG. 1A. To limit this effect, it is proposed to have limited clamp dimensions. The tension variation due to a clamp 105 rotating around a roller 108 is determined by the distance between the stamp mounting opening 205 in the stamp holder 206 and the pivot point of the clamp on the belt which is the position of the belt connector pin 210, if using one connector pin. This distance should be minimal, preferably zero. For the clamp design this preference can be split in two dimensions as shown in FIG. 6B:

The vertical distance $d_{cv}$ between the stamp mounting opening 205 in the clamp holder 206 and the base of the clamp 105: The base of the clamp is the side of clamp which is in contact with the belt. In a rough calculation the flexible stamp will expand 50 micron, if the distance of the mounting of the stamp 205 to the base of the clamp, $d_{cv}$ is 1 cm for an expanding stamp with a length of 1 meter. To limit the impact for precise applications the distance $d_{cf}$ is proposed to be preferably below 2 cm, most preferable 0 cm.

The horizontal distance $d_{ch}$ between the stamp mounting opening 205 in the clamp holder 206 and the pivot point of the belt, which is the same location as that of the connector pin 210, if one pin is used. The impact of a distance $d_{ch}$ on tension variation, if a clamp rotates around a roller, does depend on different variables as the diameter of the roller, the position of the clamp moving around the roller, and the length of the stamp which will be expanded. A distance $d_{ch}$ of 2 cm between the pivot point of the clamp 210 and the stamp mounting opening 205 can result in an expansion over 1 mm for a roller with a radius of 110 mm. For precise applications this tension variation is too large. It is proposed that the horizontal distance $d_{ch}$ between the pivot position 210 of the clamp and the stamp mounting opening 205 on the clamp is preferably below 1 cm, most preferable 0 cm.

FIG. 7 shows a further preferred embodiment of the apparatus according to the present invention, wherein the clamps 105A and 105B do not pass a roller while imprinting. Most easy is to keep the clamps in horizontal position, as shown in FIG. 7A and FIG. 7B. In this case, the forces on the stamp due to gravity are kept constant. A further preferred embodiment of the apparatus setup according to the present invention is shown in FIG. 7C, where the back clamp 105B is placed at a vertically angle. Note that the movement of the clamps can be at other angles than shown in FIG. 7C. The condition is that the angle of clamp movement is constant. The different embodiments depicted in FIGS. 7A, 7B and 7C show at the left side, i.e., in FIG. 7A(1), FIG. 7B(1), and FIG. 7C(1) the flexible stamp setup before imprinting, and at the right side, i.e., in FIG. 7A(2), FIG. 7B(2), and FIG. 7C(2) the flexible stamp set up after imprinting, just after passing the UV bar 111. In all these cases the forces on the stamp due to gravity are kept constant during imprinting, minimizing tension variations.

FIG. 7A shows a further preferred embodiment of the apparatus according to the present invention, wherein 2 rollers 108A and 108B are used and both clamps 105A and 105B move in horizontal direction while imprinting the substrate 101.

FIG. 7B shows a further preferred embodiment of the apparatus according to the present invention, wherein 4 rollers are used and both clamps 105A and 105B move in horizontal direction while imprinting the substrate 101.

FIG. 7C illustrates a further preferred embodiment of the apparatus according to the present invention, wherein the imprinting of substrate 101 is done while back clamp 105B moves in vertical direction, as shown in FIGS. 7C(1) and 7C(2). This preferred apparatus and flexible stamp design results in a shorter flexible stamp length L. However, to enable the vertical movement without passing a roller, the vertical $d_{rv}$ distance of the upper roller 108 and imprint roller 108A has to be larger than compared to FIG. 7B, resulting in a larger apparatus and in principle a larger cycle time. This can be compensated for by repositioning the rollers.

In the apparatus according to the present invention more rollers than four rollers can be used. The amount of rollers will have impact on the throughput. The preferred requirement minimizing tension variation is to keep the angle of clamp movement constant during imprinting. With this constraint a clamp should not pass a roller while imprinting. This requirement gives a constraint on the imprint apparatus as well as on the length of the flexible stamp 104. The multiple rollers should preferably be positioned in such a way that a clamp will not pass a roller while imprinting. In this preferred case the minimum roller distance between the imprint roller 108A and delamination roller 108B is defined by the length $L_{st}$ of the substrate table 101, the length $L_c$ of the clamp 105A, which is positioned in front of the substrate table, and the radius r of the roller 108A and 108B. A minimum roller distance $d_r$, between the center of imprint roller 108A and the center of roller 108B, amounts $\geq (L_c+L_{st})$. The same vertical distance between the rollers is required in the case, wherein more rollers are used: $d_{rv} \geq (L_c+L_{st})$.

Figure 1A:
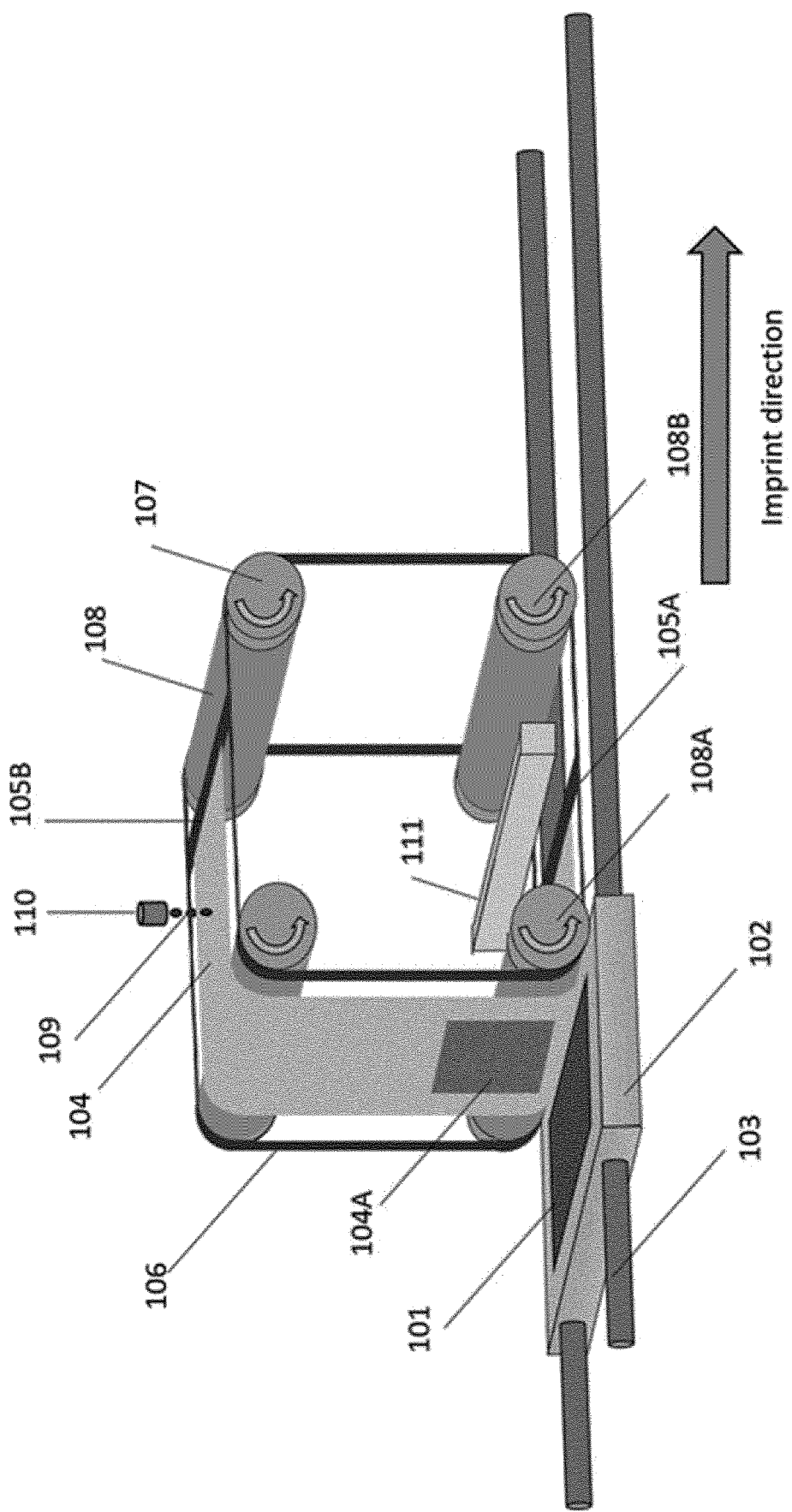
Figure 2A:
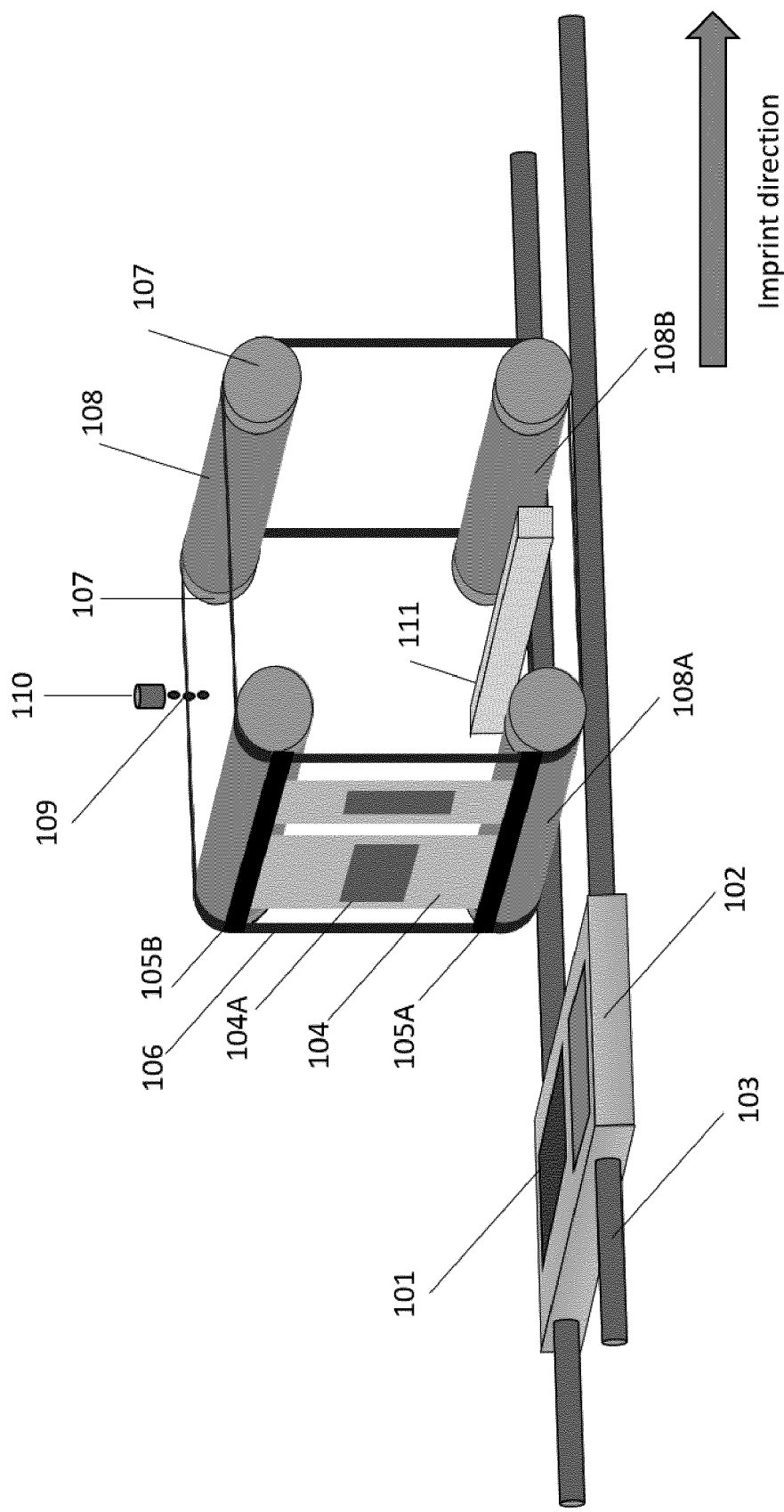
Figure 2B:
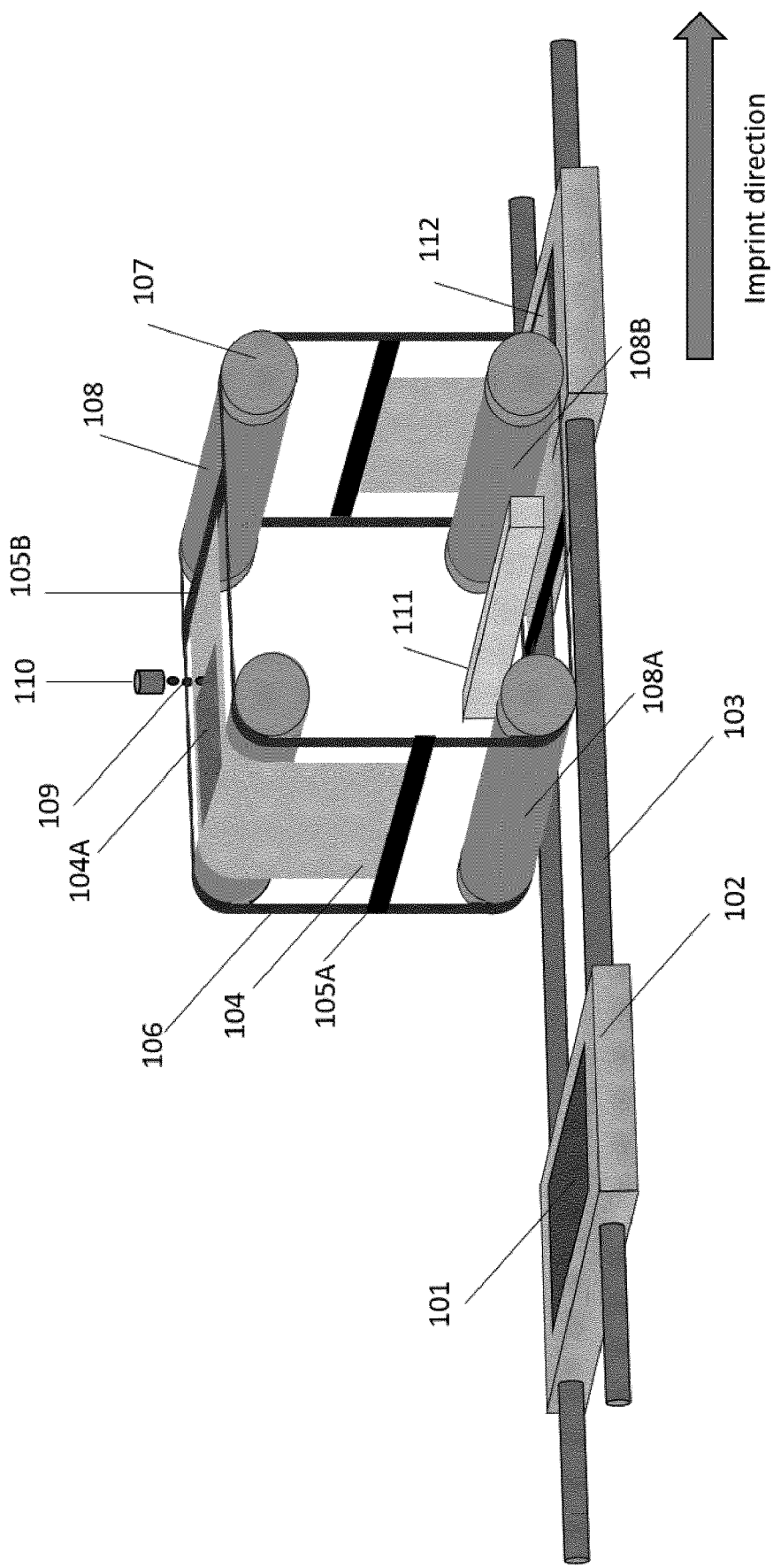
Figure 2C:
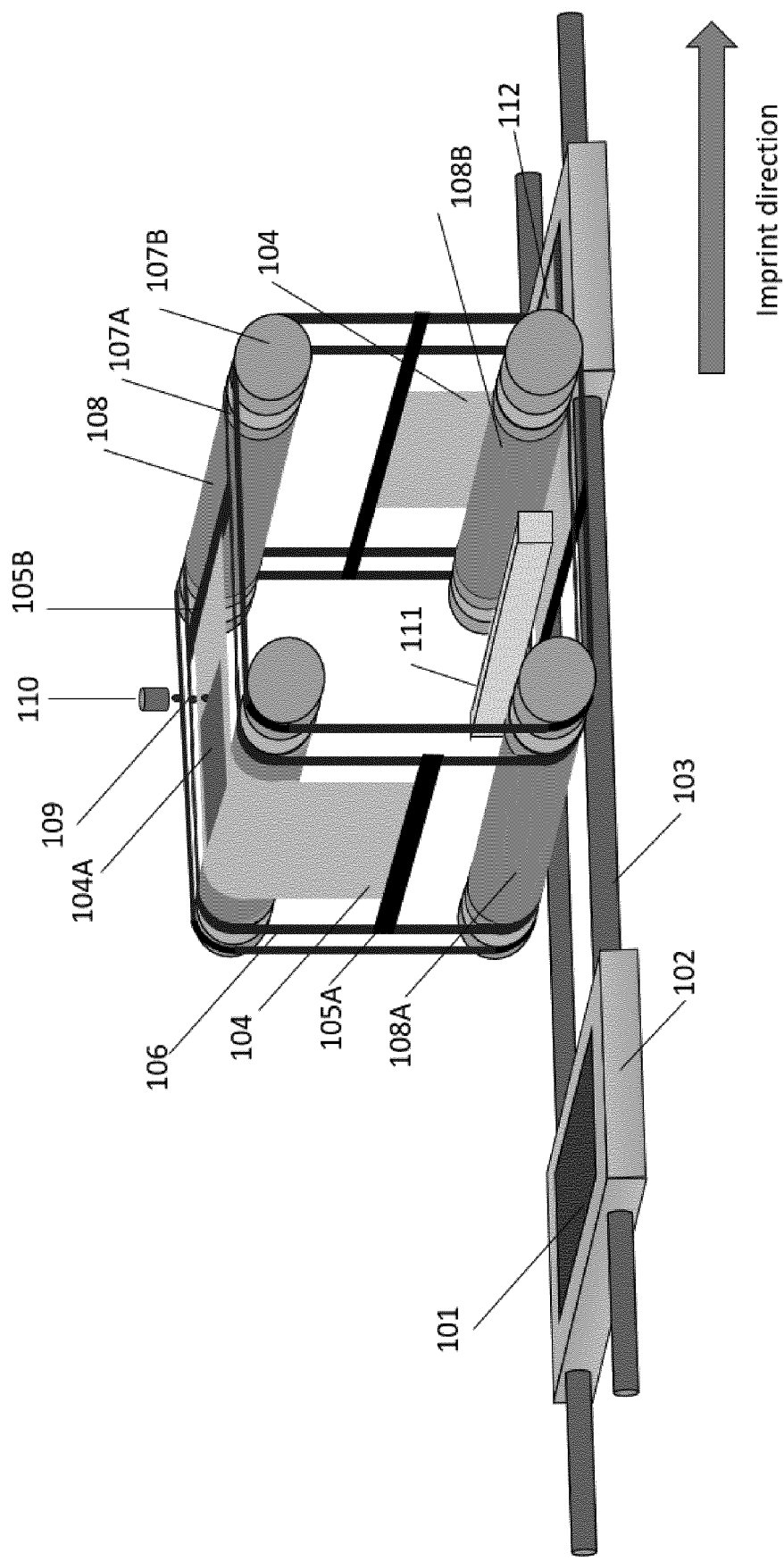
Figure 3A:
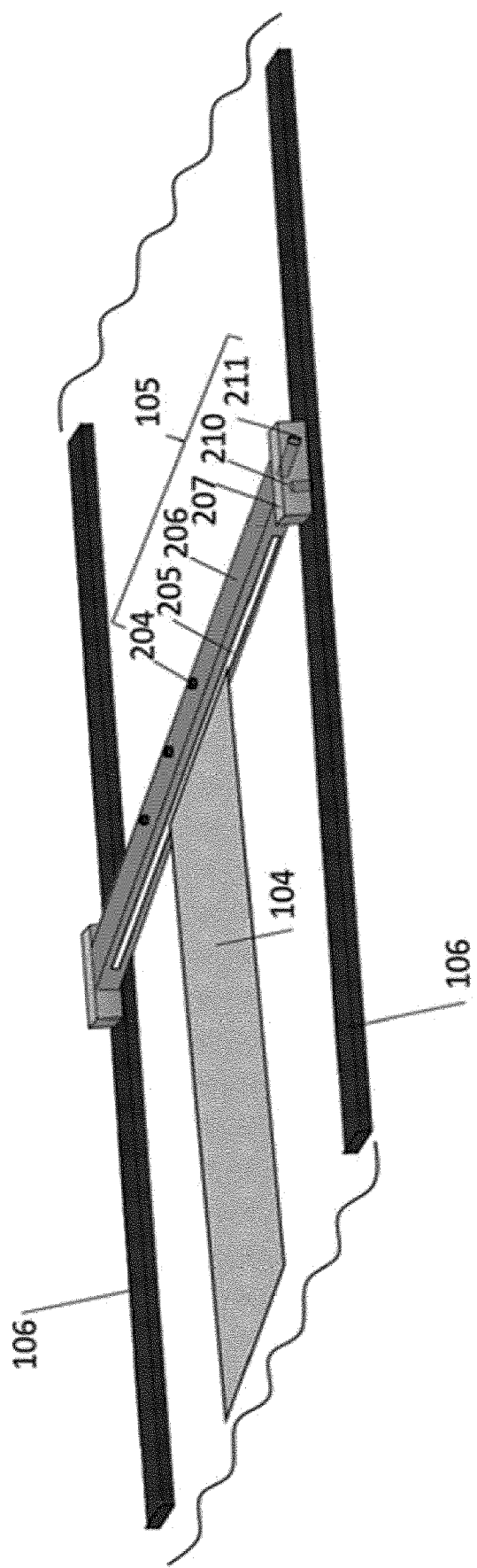
Figure 3B:
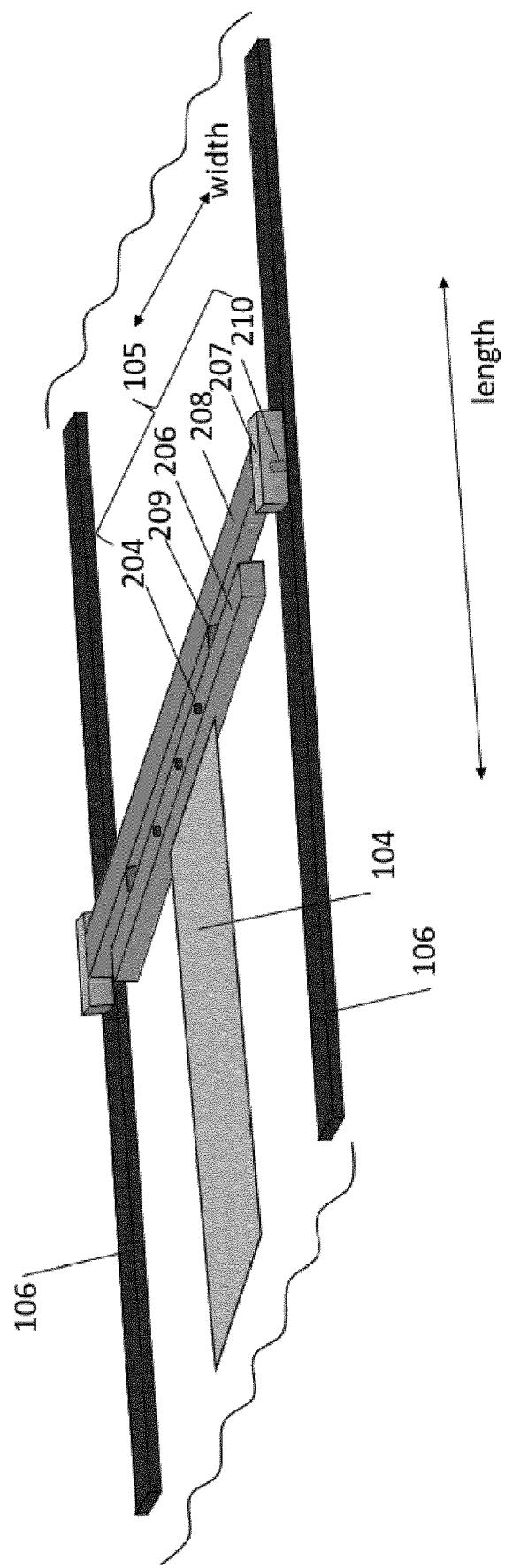
Figure 4A:
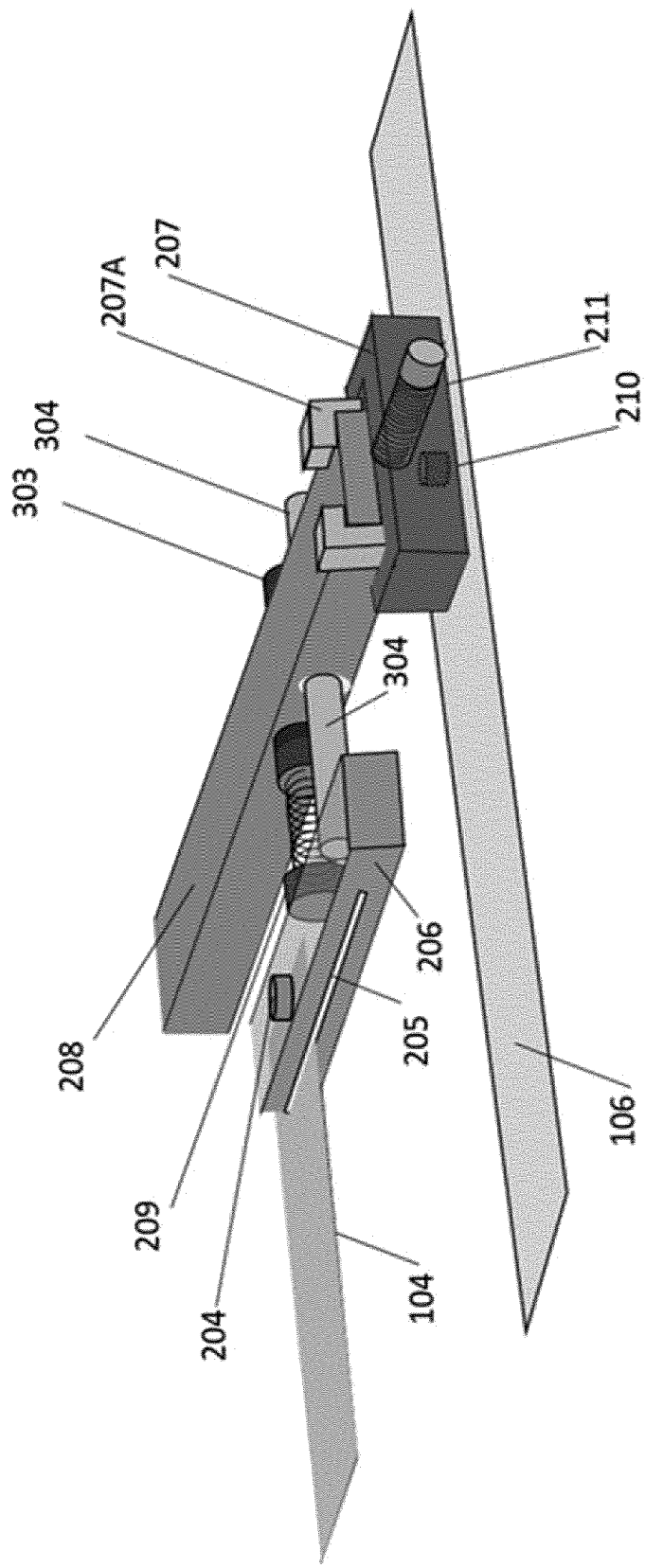
Figure 4B:
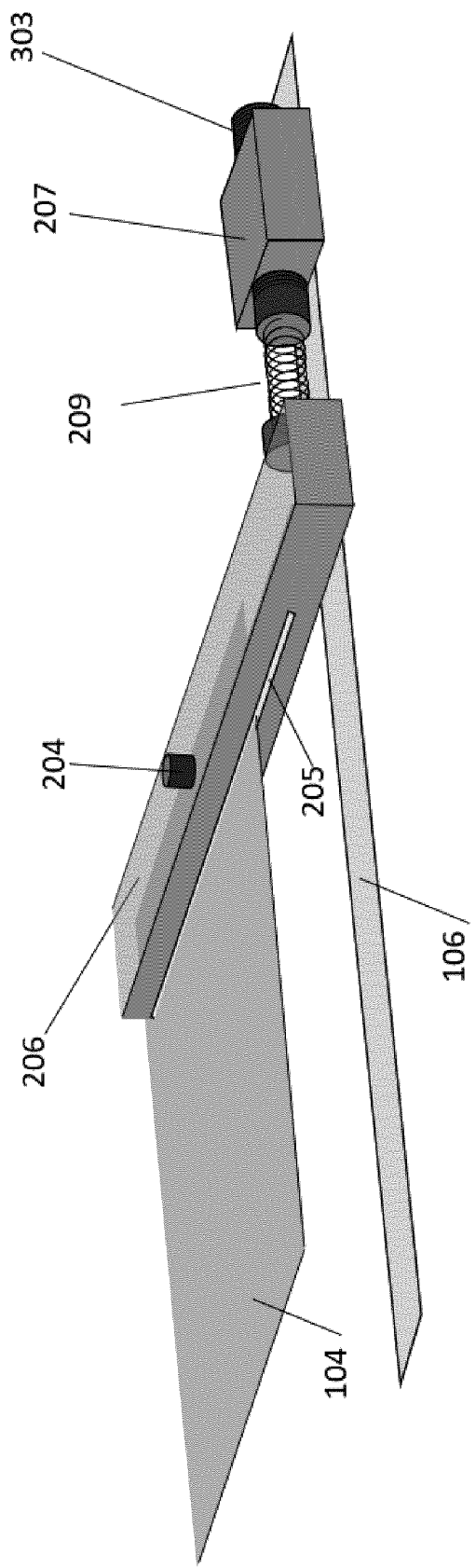
Figure 5:
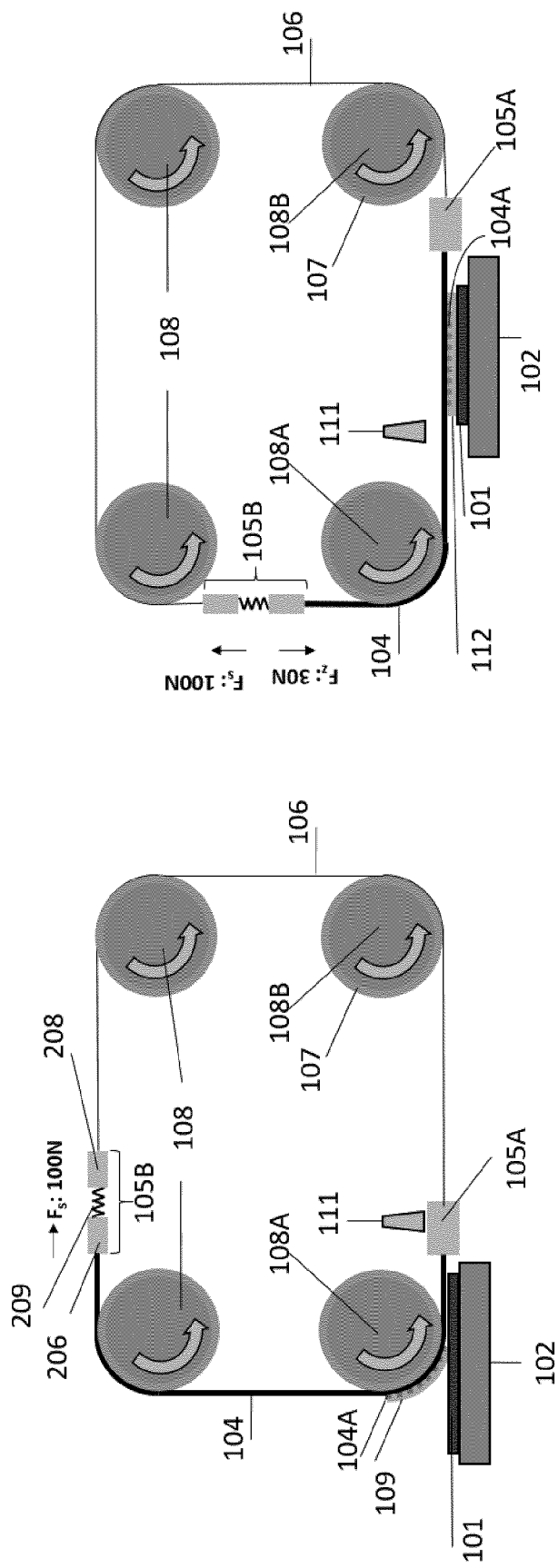
Figure 6A:
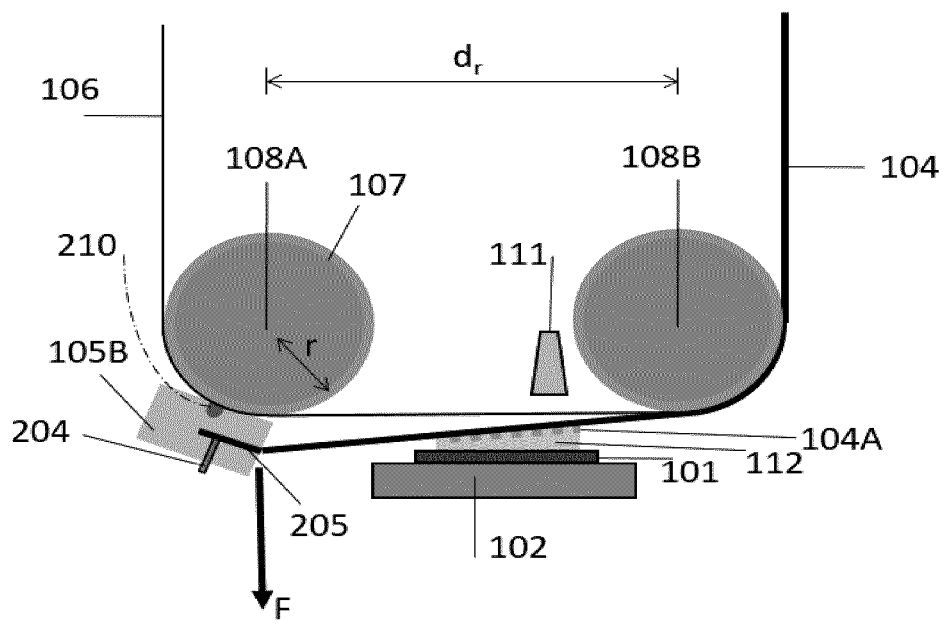
Figure 6B:
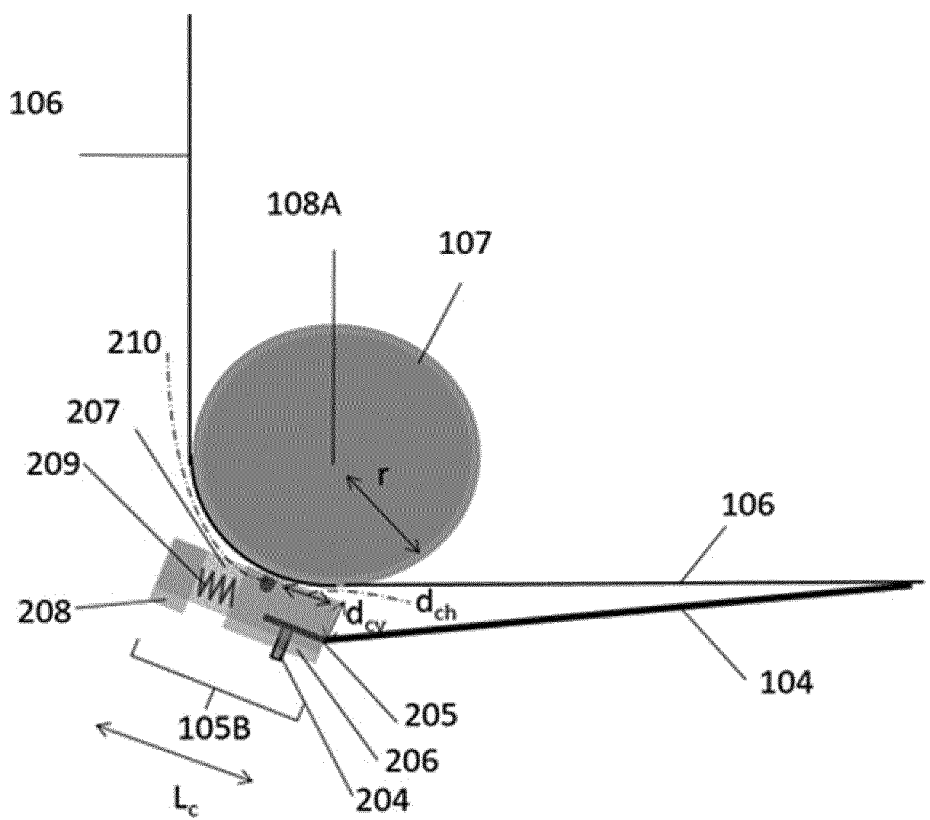

The choice of a specific apparatus design will have impact on the design of the flexible stamp. As shown in FIG. 2B, the length L of the stamp 104 will be larger than the length of the imprint pattern 112, which is replicated at the substrate 101. To obtain a replicated imprint texture 112 on a substrate, a stamp 104 with textured surface area 104A is required, whereby the textured surface area 104A has the same or larger areal dimensions as the imprint texture 112. The substrate 101 will have same or larger dimensions as the imprint texture 112. The substrate table 103 will have same or larger dimensions as the substrate 101. The flexible stamp 104 with textured surface area 104A will have to be larger as the substrate table 103. An onset areal segment with minimal length $L_{cm}$ is required for the mounting of the stamp 104 in the mounting opening 205 of the stamp holder 206 of the front clamps 105A as shown in FIG. 4A. At the backside an end areal segment is needed for the mounting of the stamp in the mounting opening 205 of the stamp holder 206 of the back clamps 105B. Moreover an additional length of ¼*r is required to fulfill the requirement that the clamp 105 does not pass a roller 108 while imprinting. This results in a total minimum length L of the stamp of $L \geq 2*L_{cm}+L_{st}+¼*r$. In the case, wherein the clamp will remain in horizontal position while imprinting as shown in FIGS. 7A and 7B, the stamp minimum length will be larger $L \geq 2*L_{cm}+L_{st}+½*r$. The maximum length of the stamp is determined by the length of the belt 106.

Figure 8:
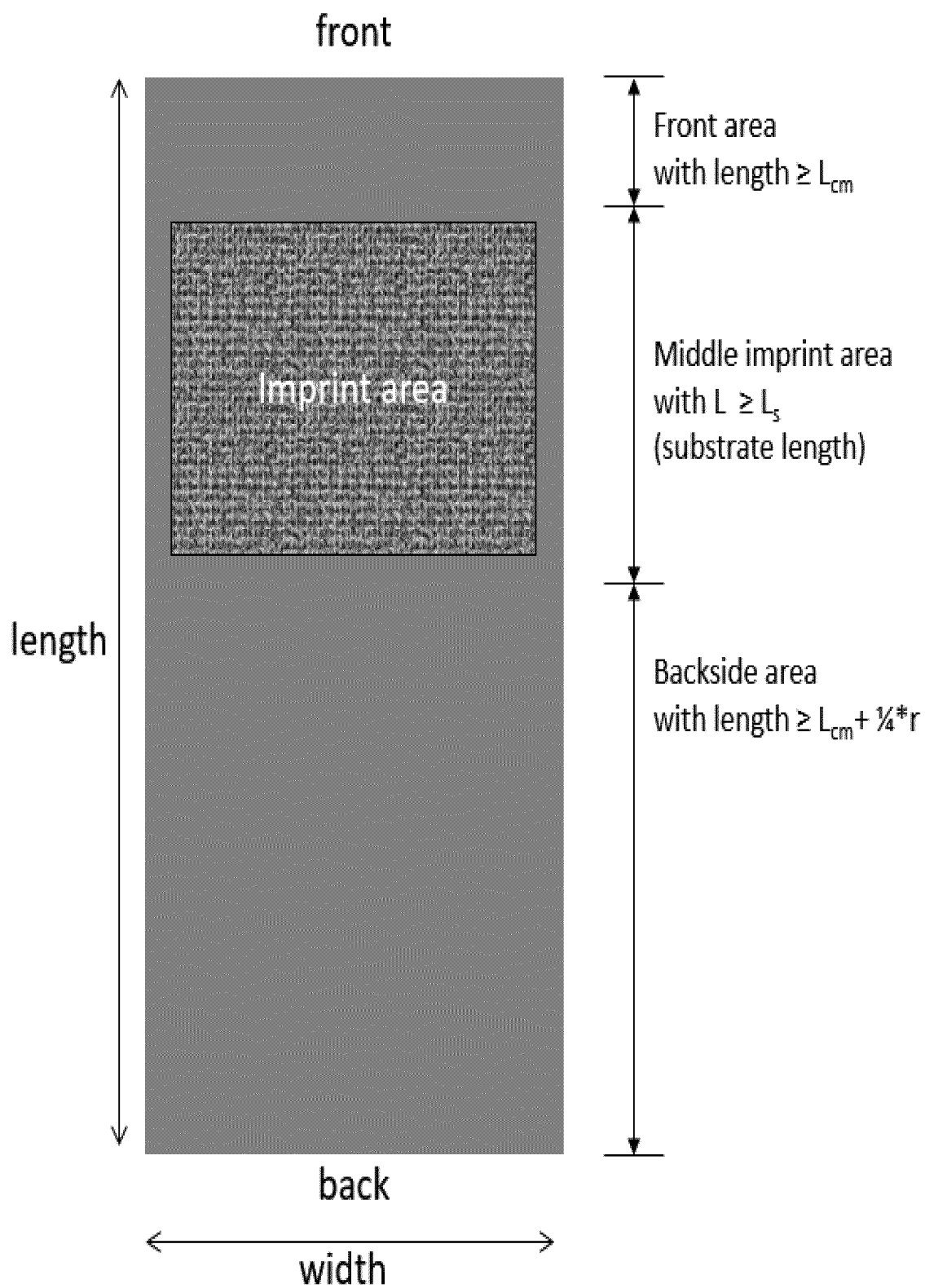
Figure 8:
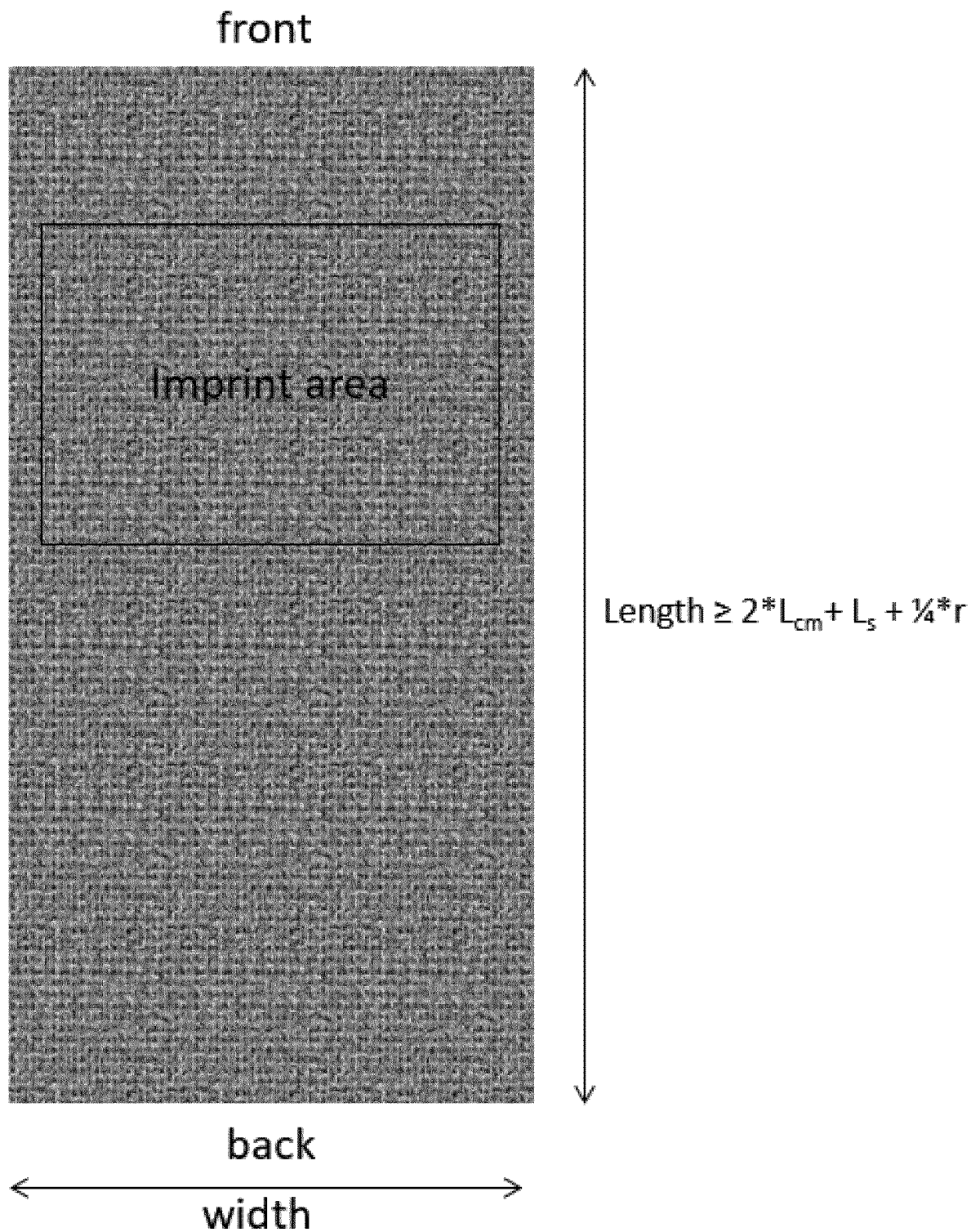

This preferred embodiment is shown in FIG. 8(1) and FIG. 8(2). The flexible stamp 104 can be partly textured with the required imprint area 104A or fully covered with the inverse of the required imprint texture as shown in FIG. 8(2). If the flexible stamp is only partly textured, the position of the textured area TSA on the stamp is defined, having a minimum onset segment $L_{cm}$ for mounting of the clamp and a minimum end areal segment $L_{cm}+¼*r$ for mounting of the back clamp and preventing the clamp to be rotating around a roller while imprinting, as shown in FIG. 8(1).

The invention claimed is:

1. An apparatus for imprinting on a discrete substrate with a discrete flexible stamp comprising
   a) at least a first flexible rectangular stamp having a length (L), a width (W),
      a stamp area ($A_{stamp}$), an onset, and an end, wherein the stamp comprises
         a front surface comprising an imprint texture having an imprint area ($A_{imprint}$) $\leq (A_{stamp})$, wherein the imprint texture has openings and elevations,
         a rear surface,
         an onset areal segment and an end areal segment both extending along the whole width (W) of the flexible stamp, wherein
         the onset areal segment extends for an onset length ($L_{onset}$), and
         the end areal segment extends for an end length ($L_{end}$)
         along the length (L) of the stamp,
   b) at least a first clamp which clamps the onset areal segment of the flexible stamp and at least a second clamp which clamps the end areal segment of the flexible stamp,
   c) a first roller which is an imprint roller,
   d) at least one driven belt connected with the first clamp and with the second clamp and capable of moving the clamped flexible stamp along its length (L) and with its rear surface over the imprint roller for an imprinting distance ($I_d$) to imprint the imprint texture of the flexible stamp onto a substrate by contacting the front surface of the flexible stamp and the substrate with a lacquer in between so that the lacquer is provided with an imprinted texture replicating an imprinted area (A') on the substrate, and wherein the belt is capable to move the stamp in a moving direction,
      wherein the moving direction either is an imprinting direction or a direction opposite to the imprinting direction,
   wherein
   either the imprint roller is not able to cause its own rotation, but is driven by the stamp which in turn is driven by the belt which in turn is driven by a belt driving device, or the imprint roller is driven at the same speed as the belt by a roller driving device which follows the belt driving device in a master slave configuration.

2. The apparatus according to claim 1, wherein the apparatus comprises at least a first flexible stamp clamped between the first clamp and the second clamp, wherein the first clamp and the second clamp are connected with a first pair of belts, and wherein the apparatus further comprises at least a second flexible stamp clamped between a third clamp and a fourth clamp, wherein the third clamp and the fourth clamp are connected with a second pair of belts, and wherein the first pair of belts can be steered independently from the second pair of belts.

3. The apparatus according to claim 1, wherein the apparatus comprises at least a first stamp clamped between the first clamp and the second clamp, wherein the first clamp and the second clamp are connected with a first pair of belts, and wherein the apparatus further comprises at least a second stamp clamped between a third clamp and a fourth clamp, wherein the third clamp and the fourth clamp are connected with the same first pair of belts, and wherein two or more stamps are transported simultaneously.

4. The apparatus according to claim 1, wherein at least the second clamp comprises a connector which pins the clamp on the at least one driven belt, and a flexible stamp holder which holds the flexible stamp.

5. The apparatus according to claim 4, wherein the clamp connector comprises an easy mounting part, which ensures easy placement and removal of the stamp holder on and off the belt.

6. The apparatus according to claim 5, wherein the first and/or the second clamp, comprises a stamp holder position alignment pin which adjusts the distance between the stamp holder and the position of the clamp connector on the belt, whereby the stamp holder will be moved in perpendicular direction relative to the movement direction of the belt.

7. The apparatus according to claim 4, wherein the stamp holder holds one or more flexible stamps, wherein the stamps have the same length and the same or a different width.

8. The apparatus according to claim 4, wherein at least the second clamp comprises one or more additional guiding pins, which guide the movement of the stamp holder in the same or opposite direction as the belt movement.

9. The apparatus according to claim 1, wherein at least the second clamp is provided with an integrated device for control and adjustment of the flexible stamp tension, and wherein the device comprises a material or component which is capable to act as a spring, and which controls and adjusts the flexible stamp tension.

10. The apparatus according to claim 9, wherein the material comprises one or more springs.

11. The apparatus according to claim 10, wherein the one or more springs comprise spiral springs, leaf springs, rotational springs, or tension springs, and wherein the tension of the flexible stamp is controllable by the tension of the springs either by adjusting the length of the springs and/or the distance of the clamps and/or adjusting the spring constant.

12. The apparatus according to claim 9, wherein the material or component comprises one or more rubber sheets.

13. The apparatus according to claim 1, wherein a distance $d_{ch}$ between a mounting opening of a stamp holder and a base of the first clamp or the second clamp is below 5 cm.

14. The apparatus according to claim 1, wherein a distance ($d_{ch}$) between the mounting opening of the stamp holder and a pivot position of the first clamp or the second clamp on the belt is below 5 cm.

15. The apparatus according to claim 1, wherein the stamp has
the onset areal segment with the onset length $(L_{onset}) \geq (L_{cm})$,
wherein $(L_{cm})$ is the minimal length which is required for the mounting of the stamp in the mounting opening of the stamp holder,
a middle imprint areal segment with a length $(L_{middle}) \geq (L_s)$,
wherein $(L_s)$ is a length of the substrate, and
the end areal segment with the end length $(L_{end}) \geq (L_{cm}) + \frac{1}{4} \cdot (r)$,
wherein (r) is a radius of the imprint roller,
and wherein a maximum length of the stamp is $(L_{max}) \leq (L_b)$, wherein $(L_b)$ is a length of the belt.

* * * * *